United States Patent
Tavakkoli Kermani Ghariehali et al.

(10) Patent No.: US 11,774,849 B2
(45) Date of Patent: Oct. 3, 2023

(54) METHOD AND SYSTEM FOR ADJUSTING EDGE POSITIONS OF A DROP PATTERN

(71) Applicant: CANON KABUSHIKI KAISHA, Tokyo (JP)

(72) Inventors: Amir Tavakkoli Kermani Ghariehali, Austin, TX (US); Edward Brian Fletcher, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 261 days.

(21) Appl. No.: 17/028,731

(22) Filed: Sep. 22, 2020

(65) Prior Publication Data

US 2022/0091500 A1   Mar. 24, 2022

(51) Int. Cl.
  *G03F 7/00* (2006.01)
  *G06F 30/12* (2020.01)
  *G07F 17/00* (2006.01)

(52) U.S. Cl.
  CPC ............ *G03F 7/0002* (2013.01); *G06F 30/12* (2020.01); *G07F 17/0014* (2013.01)

(58) Field of Classification Search
  None
  See application file for complete search history.

(56) References Cited

U.S. PATENT DOCUMENTS

| | | | |
|---|---|---|---|
| 6,936,194 B2 | 8/2005 | Watts | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,119,052 B2 | 2/2012 | Schumaker | |
| 8,349,241 B2 | 1/2013 | Sreenivasan et al. | |
| 8,586,126 B2 | 11/2013 | Schumaker | |
| 10,481,491 B2 | 11/2019 | Fletcher et al. | |
| 10,634,993 B2 | 4/2020 | Fletcher | |
| 2004/0228964 A1 | 11/2004 | Ito et al. | |
| 2010/0096764 A1 | 4/2010 | Lu | |
| 2010/0099322 A1 | 4/2010 | Katagami et al. | |
| 2019/0139789 A1 | 5/2019 | Tavakkoli Kermani Ghariehali et al. | |
| 2020/0096863 A1 | 3/2020 | Ozturk et al. | |
| 2020/0292934 A1* | 9/2020 | Simpson | B29C 35/0805 |

* cited by examiner

*Primary Examiner* — Robert J Grun
(74) *Attorney, Agent, or Firm* — Daniel Ratoff

(57) ABSTRACT

A system and method of generating a drop pattern. The method may include receiving an initial drop pattern. The method may include receiving a target drop pattern exclusion edge for each of a plurality of locations. The method may include receiving one or more constraints of a dispensing system. The method may include generating a base drop pattern exclusion edge line based on the target drop pattern exclusion edge. The method may include generating a new drop pattern wherein drops deposited at an edge of the new drop pattern are positioned on integer multiples of the pitch constraint from the optimum base drop pattern exclusion edge line.

16 Claims, 22 Drawing Sheets

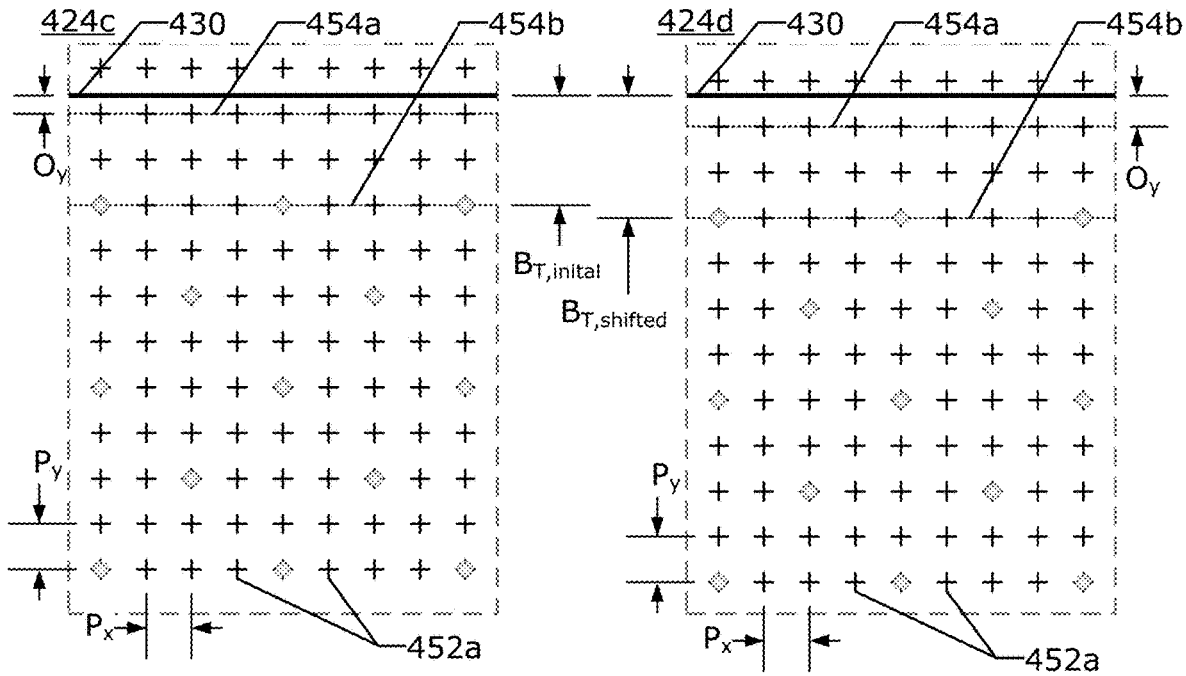
FIG. 4C
FIG. 4D
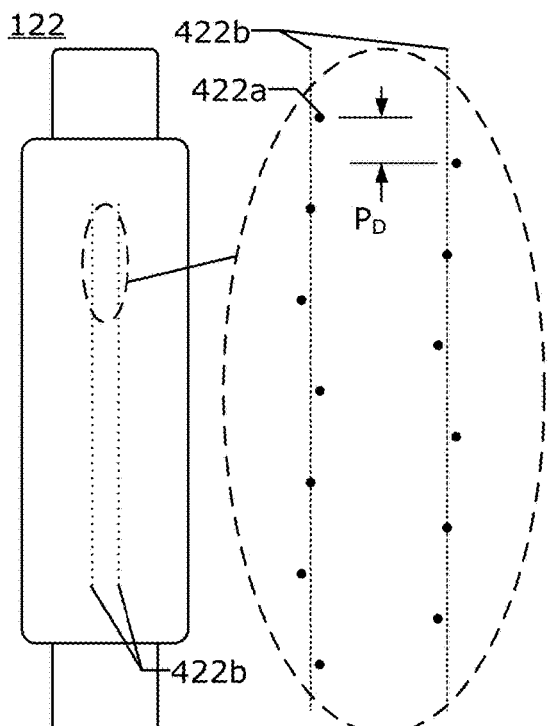
FIG. 4E
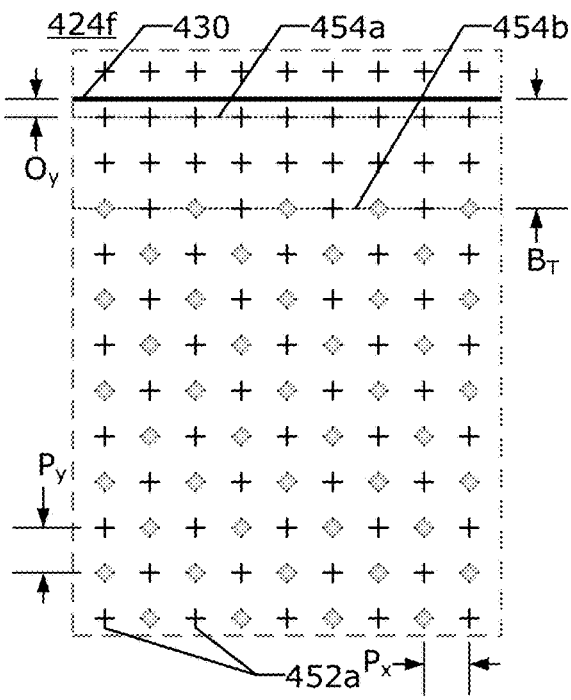
FIG. 4F

S632

METHOD AND SYSTEM FOR ADJUSTING EDGE POSITIONS OF A DROP PATTERN

BACKGROUND OF INVENTION

Technical Field

The present disclosure relates to systems and methods of generating a drop pattern for nanoimprint lithography. In which the edge positions of the drop pattern are adjusted.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate. The formable liquid is applied onto the substrate. The template is brought into contact with the formable liquid that may have been deposited as a drop pattern causing the formable liquid to spread and fill the space between the template and the substrate. The formable liquid is solidified to form a film that has a shape (pattern) conforming to a shaping surface of the template. After solidification, the template is separated from the solidified layer such that the template and the substrate are spaced apart.

The substrate and the solidified layer may then be subjected to known steps and processes for device (article) fabrication, including, for example, curing, oxidation, layer formation, deposition, doping, planarization, etching, formable material removal, dicing, bonding, and packaging, and the like. For example, the pattern on the solidified layer may be subjected to an etching process that transfers the pattern into the substrate.

SUMMARY OF THE INVENTION

A first embodiment, may be a method of generating a drop pattern. The method may include receiving an initial drop pattern. The method may include receiving a target drop pattern exclusion edge (DEE) for each of a plurality of locations. The method may include receiving one or more constraints of a dispensing system. The method may include generating a base drop pattern exclusion edge line based on the target drop pattern exclusion edge. The method may include generating a new drop pattern wherein drops deposited at an edge of the new drop pattern are positioned on integer multiples of the pitch constraint from the optimum base drop pattern exclusion edge line.

In an aspect of the first embodiment, the one or more constraints may include a dispensing pitch constraint of the dispensing system perpendicular to the edge of the new drop pattern.

In an aspect of the first embodiment, the target drop pattern exclusion edge may be a largest distance from a first imprint field edge for a given location along the first imprint field edge at which the area adjacent to the first imprint field edge under a mesa may be predicted to be filled with formable material from the new drop pattern.

In an aspect of the first embodiment, the base drop pattern exclusion edge line may be a straight line parallel to an average position of a side wall of a mesa that may be used for imprinting the new drop pattern.

In an aspect of the first embodiment, determining an optimum base drop pattern exclusion edge line may include determining a difference between positions of drops on the edge of the new drop pattern and the target drop pattern exclusion edge.

The first embodiment, may further comprise: determining a minimum value of the target drop pattern exclusion edge; and determining a maximum value of the target drop pattern exclusion edge. The base drop pattern exclusion edge line may be between the minimum value and maximum value.

In an aspect of the first embodiment, the new drop pattern may minimize extrusion defects and non-fill defects.

In an aspect of the first embodiment, constraints of the dispensing system may include a set of potential dispense locations and their relative positions to each other.

In an aspect of the first embodiment, an origin position of the set of potential dispense location may be adjustable relative to the mesa sidewall and the origin position intersects with the base drop pattern exclusion edge line.

The first embodiment, may further comprise generating a shifted drop pattern by shifting the initial drop pattern such that a portion of the dispensed drops land on the optimum base drop pattern exclusion edge line.

The first embodiment, may further comprise determining a set of integer multiples which vary along the imprint field edge on which indicated dispensable pitch offsets from an optimum base drop pattern exclusion edge line on which drops are to be positioned. The first embodiment may also further comprise adding drops to the shifted drop pattern which take into account integer multiples and the local pitch of the shifted drop pattern near the imprint field edge.

The first embodiment, may further comprise determining a set of integer multiples which vary along the imprint field edge on which indicated dispensable pitch offsets from an optimum base drop pattern exclusion edge line on which drops are to be positioned. The first embodiment may also further comprise removing drops to the shifted drop pattern which take into account the integer multiples and the local pitch of the shifted drop pattern near the imprint field edge.

The first embodiment, may further comprise determining a set of integer multiples which vary along the imprint field edge on which indicated dispensable pitch offsets from an optimum base drop pattern exclusion edge line on which drops are to be positioned. The first embodiment may also further comprise moving drops in the shifted drop pattern which take into account the integer multiples and the local pitch of the shifted drop pattern near the imprint field edge.

The first embodiment, may further comprise a method of manufacturing articles including using the method of generating the drop pattern. The method of manufacturing articles may further comprise dispensing formable material with the generated drop pattern onto a substrate. The method of manufacturing articles may further comprise contacting the dispensed formable material with a template. The method of manufacturing articles may further comprise solidifying the formable material under the template. The method of manufacturing articles may further comprise separating the template from the solidified formable material to form a film layer on the substrate. The method of manufacturing articles may further comprise processing the substrate on which the film layer is produced so as to manufacture the articles.

A second embodiment, may be a system comprising: a memory; and a processor. The processor may be configured to receive an initial drop pattern. The processor may be further configured to receive a target drop pattern exclusion edge for each of a plurality of locations. The processor may be further configured to receive one or more constraints of a dispensing system. The processor may be further configured to generate a base drop pattern exclusion edge line based on the target drop pattern exclusion edge. The processor may be further configured to generate a new drop pattern wherein drops deposited at an edge of the new drop pattern are positioned on integer multiples of the pitch constraint from the optimum base drop pattern exclusion edge line.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIGS. 4C, 4D, and 4F are illustrations of potential drop locations and a portion of a drop pattern at an edge of an imprint field as used in embodiments.

FIG. 4E is an illustration of a dispenser and a detail view of the nozzles on the dispenser.

Figure 1:
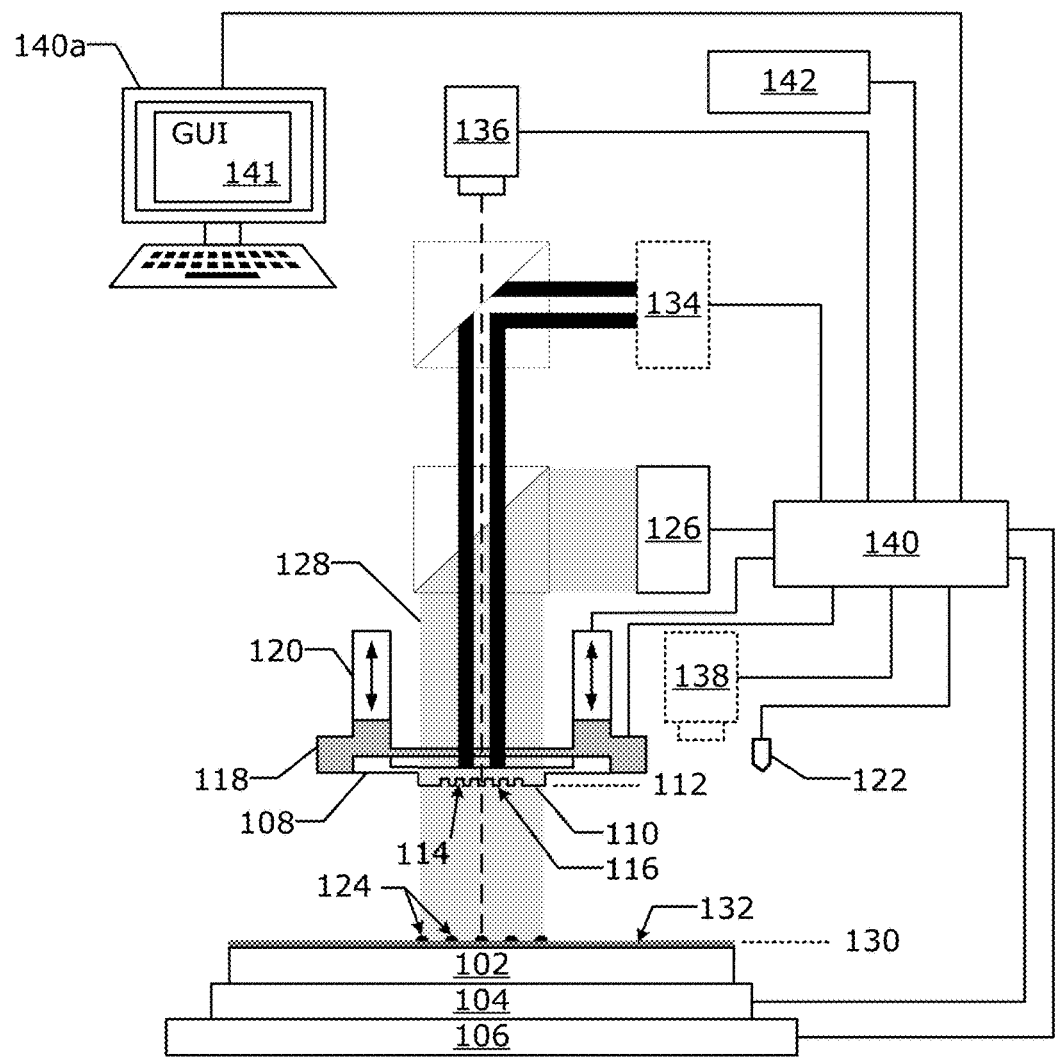
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprinting lithography technique can be used to shape a film on a substrate from a plurality of droplets of formable material. The shaping process includes bringing a template into contact with the plurality of droplets of the formable material which fill a gap between the template and the substrate. The template includes a shaping surface on a mesa that extends above a recessed surface. The template also includes mesa sidewalls that surround the mesa and connect the shaping surface to the recessed surface. During the shaping process the formable material spreads, over a filling period, due to capillary action and other forces such that the formable material spreads toward the mesa sidewalls. This shaping process may be done repeatedly across multiple shaping fields and across multiple substrates.

Extrusion defects can form when formable material wets the mesa sidewalls during the shaping process. After the formable material is exposed to actinic radiation, and the template separates from the formable material, one or more extrusion defects may stay on the substrate and/or template. Non-fill defects can form when the formable material does not reach the edge of the mesa or does not fill features within the template.

An optimum filling time is a period of time which it takes the formable material to reach the mesa sidewall without forming extrusion defects or non-fill defects. The actual filling period starts from the contact of the shaping surface initially contacting a portion of the formable material until the formable material is cured. The applicant has found that different locations on the mesa sidewall have different optimum filling times. This is due to: the shape of the template; variation in a contact area between the shaping surface and the formable material during the filling period; features in the template near the mesa sidewall; and features in the substrate near an edge of the imprint field. For example, the optimum filling time near marks is greater than the optimum filling time in regions that do not have features (open areas). Variation in the density of features in both template and the substrate effects the variation in the optimum filling time. In addition, the edges of the mesa may have curved portions. The actual filling period should be more than the maximum optimum filling time in all locations. Variation in the optimum filling time in different locations causes extrusion or non-fill defects. If the optimum filling time in one location is greater than the actual filling period, a non-fill defect is likely to appear. If the optimum filling time in one location is less than the actual filling period, an extrusion is likely to appear. The preferred condition is that the optimum filling time in all locations is equal to the actual filling period.

The applicant has found that not placing droplets of formable material in a drop exclusion region adjacent to the mesa sidewalls helps prevent extrusion defects. An inner edge of the drop exclusion region is a drop edge exclusion (DEE). Ideally, droplets placed on the DEE are unlikely to produce extrusions defects or non-fill defects. Previous methods to address this issue include: using a straight line DEE or manually tweaking the position of droplets until non-fill defects and extrusion defects are reduced. By optimizing the DEE it is possible to minimize variation in the optimum filling time thus minimizing defects over the actual filling period. This optimization is limited by constraints on the dispensing system such as pitch of dispensable locations. What is needed is an automated method of taking into account variation in the optimum filling time that takes into account the limitations of the dispensing system.

Nanoimprint System (Shaping System)

FIG. 1 is an illustration of a nanoimprint lithography system 100 in which an embodiment may be implemented. The nanoimprint lithography system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system. In an alternative embodiment, the substrate chuck 104 may be attached to the base.

Spaced-apart from the substrate 102 is a template 108. The template 108 may include a body having a mesa (also referred to as a mold) 110 extending towards the substrate 102 on a front side of the template 108. The mesa 110 may have a shaping surface 112 thereon also on the front side of the template 108. The shaping surface 112, also known as a patterning surface, is the surface of the template that shapes the formable material 124. In an embodiment, the shaping surface 112 is planar and is used to planarize the formable material. Alternatively, the template 108 may be formed without the mesa 110, in which case the surface of the template facing the substrate 102 is equivalent to the mold 110 and the shaping surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The shaping surface 112 may have features defined by a plurality of spaced-apart template recesses 114 and/or template protrusions 116. The shaping surface 112 defines a pattern that forms the basis of a pattern to be formed on the substrate 102. In an alternative embodiment, the shaping surface 112 is featureless in which case a planar surface is formed on the substrate. In an alternative embodiment, the shaping surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head 120 may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all of the positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a drop pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the shaping surface 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that induces a phase change in the liquid formable material into a solid material whose top surface is determined by the shape of the shaping surface 112. The curing system may include at least a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124. In an embodiment, the actinic energy may be directed through both the template chuck 118 and the template 108 into the formable material 124 under the template 108. In an embodiment, the actinic energy produced by the radiation source 126 is UV light that induces polymerization of monomers in the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of: a CCD; a sensor array; a line camera; and a photodetector, which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting (shaping) process. The field camera 136 may also be configured to measure interference fringes, which change as the formable material spreads 124 between the gap between the shaping surface 112 and the substrate surface 130.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, apertures, filters, prisms, polarizers, windows, adaptive optics, and/or light sources. The droplet inspection system 138 may be positioned to inspect droplets prior to the shaping surface 112 contacting the formable material 124 on the substrate 102. In an alternative embodiment, the field camera 136 may be configured as a droplet inspection system 138 and used prior to the shaping surface 112 contacting the formable material 124

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatio-temporal distribution of thermal radiation. The nanoimprint lithography system 100 may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, drop dispense, slot dispense, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. The controller 140 may include a plurality of processors that are both included in the shaping system 100a and in communication with the shaping system 100a. The processor 140 may be in communication with a networked computer 140a on which analysis is performed and control files such as a drop pattern are generated. In an embodiment, there are one or more graphical user interface (GUI) 141 on one or both of the networked computer 140a and a display in communication with the processor which are presented to an operator and/or user.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the shaping surface 112, defining a patterned layer on the substrate 102. The formable material 124 is cured while the template 108 is in contact with formable material 124, forming the patterned layer on the substrate 102. Thus, the nanoimprint lithography system 100 uses an imprinting process to form the patterned layer which has recesses and protrusions which are an inverse of the pattern in the shaping surface 112. In an alternative embodiment, the nanoimprint lithography system 100 uses an imprinting process to form a planar layer with a featureless shaping surface 112.

The imprinting process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the shaping surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the shaping surface 112 in each imprint field. The patterned layer may also include one or more features such as protrusions which extend above the residual layer having a thickness. These protrusions match the recesses 114 in the mesa 110.

Template

Figure 2:
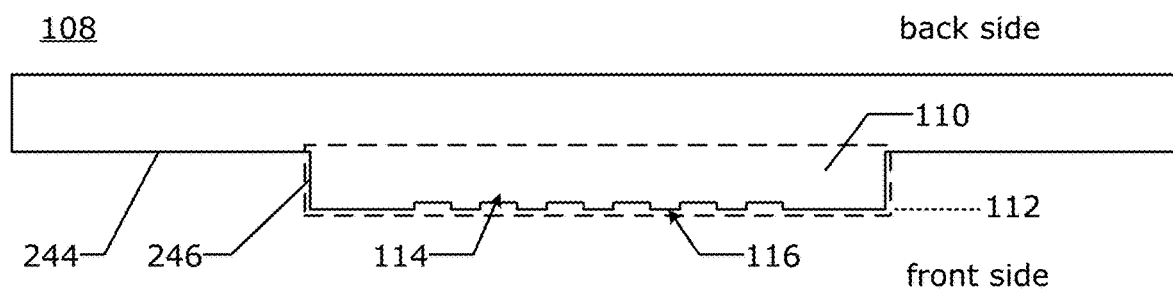
FIG. 2 is an illustration of an exemplary template that may be used in an embodiment.

FIG. 2 is an illustration of a template 108 (not to scale) that may be used in an embodiment. The shaping surface 112 may be on a mesa 110 (identified by the dashed box in FIG. 2). The mesa 110 is surrounded by a recessed surface 244 on the front side of the template. Mesa sidewalls 246 connect the recessed surface 244 to shaping surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

Imprinting Process

Figure 3:
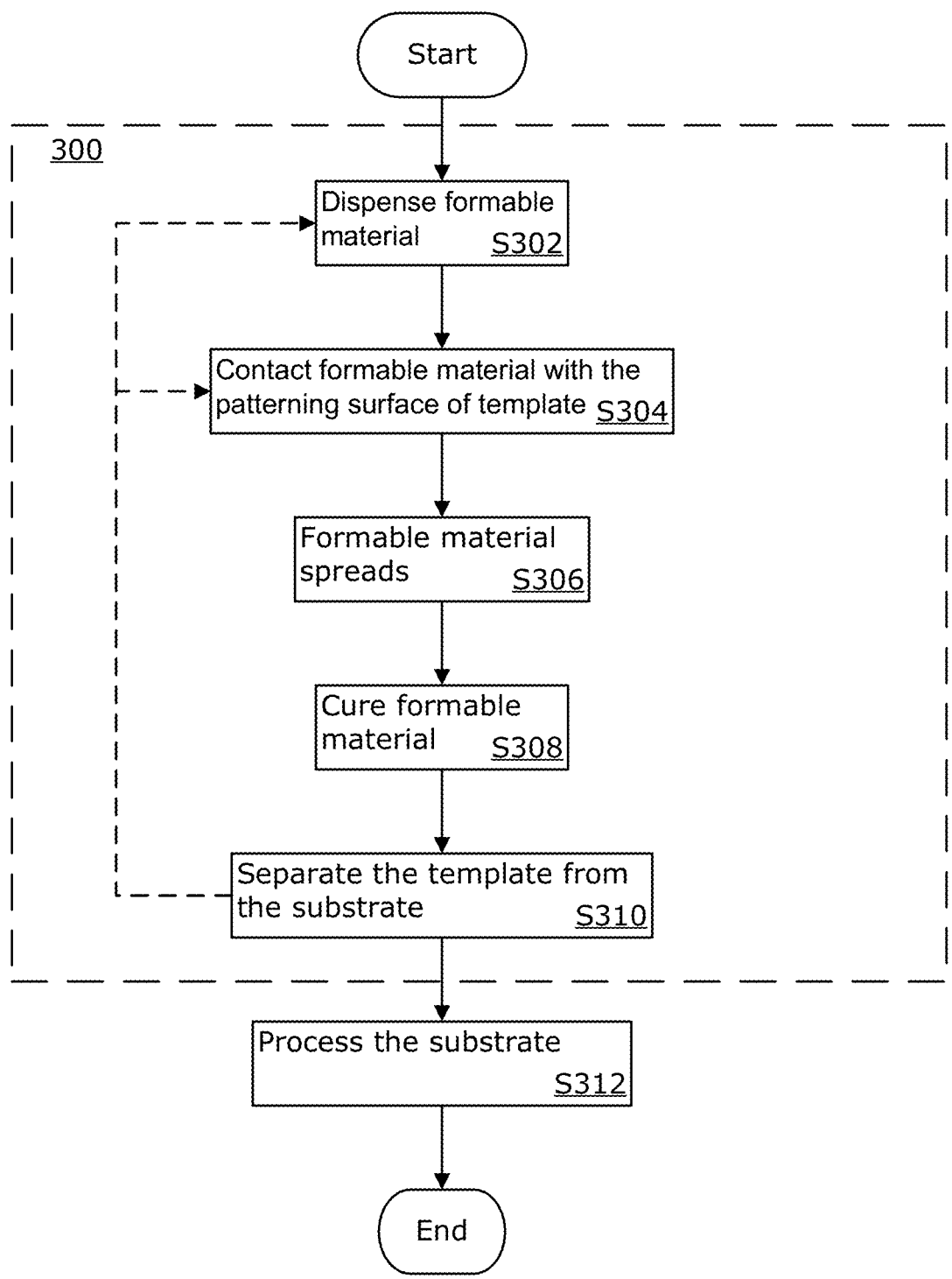
FIG. 3 is a flowchart illustrating an exemplary imprinting method as used in an embodiment.

FIG. 3 is a flowchart of a method of manufacturing an article (device) that includes an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control the imprinting process 300.

In an alternative embodiment, the imprinting process 300 is used to planarize the substrate 102. In which case, the shaping surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field (identified by an imprint field index, which may be initially set to 1) of the substrate 102 to a fluid dispense position below the fluid dispenser 122. The substrate 102, may be divided into a number of imprint fields, wherein each imprint field is identified by an imprint field index. In which the number of imprint fields is a real positive integer such as 1, 10, 62, 75, 84, 100, etc. In a dispensing step S302, the processor 140 may cause the fluid dispenser 122 to dispense formable material based on a drop pattern onto an imprint field. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field may be moved relative to the fluid dispenser 122 while the fluid dispenser is ejecting formable material 124. Thus, the time at which some of the droplets land on the substrate may vary across the imprint field.

In an embodiment, during the dispensing step S302, the formable material 124 is dispensed onto the substrate 102 in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the shaping surface 112 of the template 108 into contact with the formable material 124 in imprint field.

During a spreading step S306, the formable material 124 then spreads out towards the edge of the imprint field and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110, and the shaping surface 112. The curing illumination pattern provides enough energy to cure (polymerize) the formable material 124 under the shaping surface 112.

In a separation step S310, the processor 140 uses one or more of the substrate chuck 104, the substrate positioning stage 106, template chuck 118, and the imprint head 120 to separate the shaping surface 112 of the template 108 from the cured formable material on the substrate 102. If there are additional imprint fields to be imprinted, then the process moves back to step S302. In an alternative embodiment, during step S302 two or more imprint fields receive formable material 124 and the process moves back to steps S302 or S304.

In an embodiment, after the imprinting process 300 is finished additional semiconductor manufacturing processing is performed on the substrate 102 in a processing step S312 so as to create an article of manufacture (e.g. semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, oxidation, layer formation, deposition, doping, planarization, etching, formable material removal, dicing, bonding, packaging, mounting, circuit board assembly, and the like. The substrate 102 may be processed to produce a plurality of articles (devices).

Drop Pattern Generation

Figure 4A:
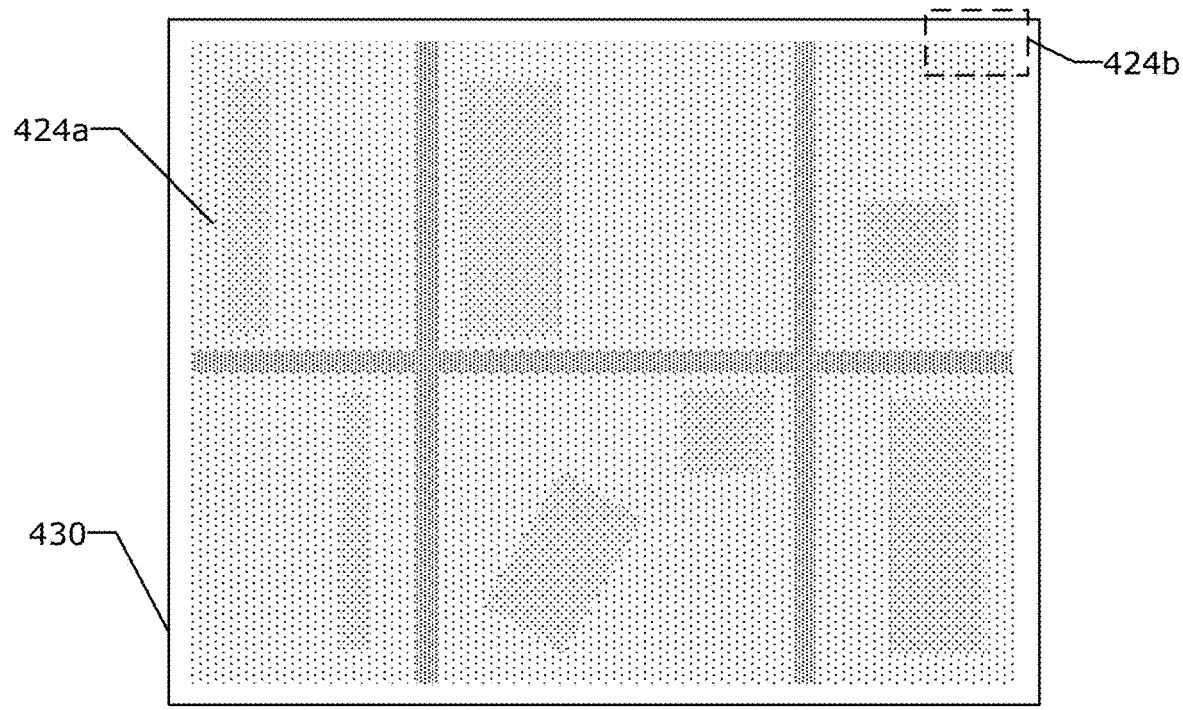
FIG. 4A is an illustration of a drop pattern in an imprint field as used in an embodiment.
Figure 4B:
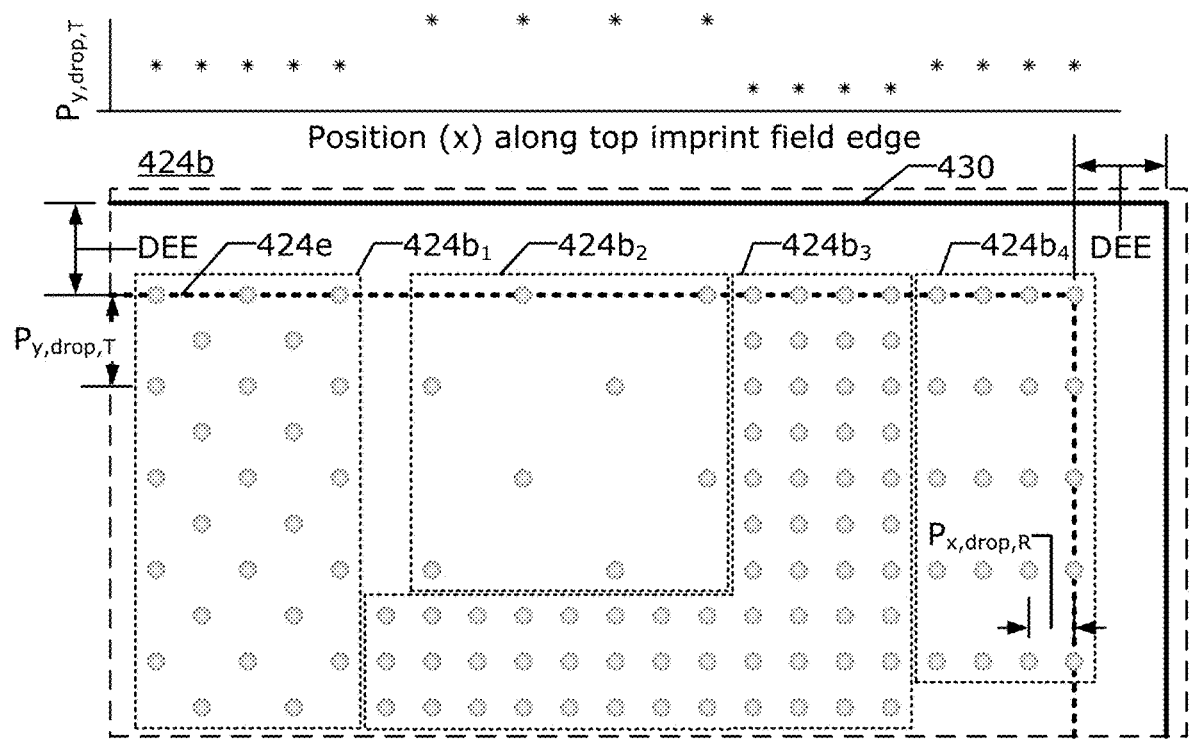
FIG. 4B is an illustration of a portion of a drop pattern at an edge of an imprint field as used in embodiments.

As discussed above, formable material 124 is dispensed in accordance with a drop pattern 424a that is received by the processor 140. FIG. 4A is an illustration of an exemplary drop pattern 424a. FIG. 4B is zoomed in an illustration of a portion 424b of the drop pattern 424a on a substrate surface 130. Numerous techniques have been developed for example in US Patent Publication No. 2019/0139789 and U.S. Pat. Nos. 8,119,052, 8,586,126, and 10,481,491 which are hereby incorporated by reference. These methods generate drop patterns based on the substrate surface 130 and the shaping surface 112. These drop patterns are designed to minimize extrusion defects 548a at an imprint field edge 430 of the imprint field and non-fill defects 548b throughout the imprint field and at the imprint field edge 430.

The imprint field is that portion of the substrate surface 130 that is imprinted by the shaping surface 112. Imprint field edges 430 on the substrate surface correspond to the edge of the mesa sidewalls 246 (the intersection of the mesa sidewalls 246 and the shaping surface 112) at the curing step S310. The drop pattern 424a is smaller than the imprint field and is inset from the imprint field edge 430. The drop patterns 424a generated by the above methods and other methods of generating drop patterns 424a use a straight line drop pattern exclusion edge (DEE) 424e. The straight line DEE 424e is a distance between the imprint field edge 430 and the drops closest to that imprint field edge as illustrated in FIG. 4B. The straight line DEE 424e is along a straight line that DEE 424e is parallel to the imprint field edge 430 or at angle relative to the imprint field edge 430.

The processor 140 and/or the networked computer 140a may generate the drop pattern 424a. Generating the drop pattern 424a may include receiving one or more files or accessing a database with information representing the substrate surface 130 and the shaping surface 130. The processor 140 and/or the networked computer 140a may calculate a distribution of formable material 124 that produces a film that fills a gap between the substrate surface 130 and the shaping surface 130 during the spreading step S306. The distribution of formable material 124 on the substrate may take the form of: an areal density of formable material; positions of droplets of formable material; and/or volume of droplets of formable material. Calculating the distribution of formable material may take into account one or more of: material properties of the formable material; material properties of the shaping surface; material properties of the substrate surface; material properties of the substrate coating; spatial variation in volume between the shaping surface and the substrate surface; directionality of fluid flow; imprint forces, evaporation; etc.

FIG. 4C is an illustration of a first portion of a drop pattern 424c near the imprint field edge 430. The droplets of formable material are represented by grey circles. The drop pattern 424a is limited by the constraints of the dispensing system. These constraints may be represented by a set of potential drop locations 452a which are illustrated as crosses in FIGS. 4C, 4D, and 4F. The crosses that do not have grey circles are positions that the drop pattern 424a indicates that a drop is not deposited at that location. The presence or absence of drops within the set of potential drop locations 452a defines the drop pattern 424a. To ease understanding FIG. 4C illustrates just a portion of the drops in the drop pattern 424a an actual drop pattern may have thousands, tens of thousands, hundreds of thousands, or millions of potential drop positions and drops depending on the application. While the drops illustrated in FIG. 4C are designated as circles in practice they may have more amorphous shapes which also vary in shape and size during the imprinting process 300.

The set of potential drop locations 452a are the locations on the substrate surface 130 that the dispensing system can deposit formable material 124. The dispensing system includes the fluid dispenser 122 and one or more portions of the positioning systems (for example the substrate positioning stage 106). The set of potential drop locations 452a may be a regular grid as illustrated in the first portions of the drop pattern in FIGS. 4C-D and F. The gird of the set of potential locations may be characterized by: a dispensable X-pitch $P_x$; a dispensable Y-pitch $P_y$; a Y-offset $O_y$; and an X-offset $O_x$. The dispensable X-pitch $P_x$ is a distance along an X-axis between centers of potential drop locations 452a. The dispensable Y-pitch $P_y$ is a distance along a Y-axis between centers of potential drop locations. The Y-axis is orthogonal to the X-axis. The Y-offset $O_y$ is a distance along the Y-axis of a reference row in the X-axis direction of the set of potential drop locations 452a from a reference line. An example of a reference line is an imprint field edge 430 parallel to the X-axis. The reference line may be any line parallel to X-axis. The reference row may be any row in the X-axis direction of the set of potential drop locations 452a and may be the row that is closest to the reference line. The X-offset $O_x$ is a distance along the X-axis of a reference row in the Y-axis direction of the set of potential drop locations 452a from a reference line. An example of a reference line is an imprint field edge 430 parallel to the Y-axis.

In an embodiment, the fluid dispenser 122 includes a plurality of nozzles 422a that are separated from each other along a single axis with a regular dispenser pitch $P_D$. One of the dispensable X-pitch $P_x$ or the dispensable Y-pitch $P_y$ is determined by the dispenser pitch $P_D$. In the following discussion, the dispensable Y-pitch $P_y$ is assumed to be equal to the dispenser pitch $P_D$ divided by the number n of passes that the fluid dispenser 122 makes across the imprint field ($P_y = P_D/n$). In which drops from one pass are equally interleaved with drops from a subsequent pass. In alternative embodiment, the passes are not equally interleaved with each other. Other arrangements may also be used for example the dispensable X-pitch $P_x$ and the dispensable Y-pitch $P_y$ may be swapped. The fluid dispenser 122 may include multiple nozzle rows 422b of nozzles 422a in which case the dispenser pitch $P_D$ is a distance in a direction parallel with the nozzle rows 422b as illustrated in FIG. 4E. An individual nozzle 422a may be slightly offset from the nozzle row 424b as illustrated in detailed view in FIG. 4E which may reduce crosstalk. This slight offset may be compensated by ejection timing or may be ignored when it small relative to droplet placement accuracy.

In an embodiment, the pitch of the grid that is not determined by the dispenser pitch $P_D$, and is determined by a minimum translation speed of the positioning system and timing limitations of the fluid dispenser 122. The minimum translation speed is determined by the throughput requirements of the nanoimprint lithography system 100. The timing limitations of the fluid dispenser 122 are determined by the accuracy of the control electronics and the crosstalk amongst nozzles within the fluid dispenser 122. In an embodiment, the positioning system translates the substrate 102 relative to the fluid dispenser in a translation direction that is orthogonal to the direction of the dispenser pitch $P_D$. In an alternative embodiment, the translation direction is not orthogonal to a direction of the dispenser pitch $P_D$ such that dispensable Y-pitch $P_y$ is reduced (assuming the dispensable Y-pitch $P_y$ is oriented closer in direction of the dispenser pitch $P_D$ then the dispensable X-pitch $P_x$ and the ejection timing for each nozzle is adjusted to take the change in translation direction into account.

The Y-offset $O_y$ is an adjustable parameter that describes a distance between the imprint field edge of one or more of the set of potential drop locations 452a along an offset line 454a (for example the closest row parallel to the imprint field edge as illustrated in FIG. 4C). The Y-offset $O_y$ may be adjusted by adjusting the position of the fluid dispenser 122 relative to each other, when the fluid dispenser 122 starts ejecting droplets during the dispensing step S302. The X-offset $O_x$ may be adjusted by adjusting the ejection timing of the nozzles 422a relative to the timing of the translation of the substrate 102 and the fluid dispenser 122 relative to each other.

Drop Pattern Refinement

The applicant has determined the performance of the imprinting process 300 can be improved if the straight DEE line 424e is replaced with a set of target variable DEE parameters that varies across the imprint field edge. The applicant has also determined that the imprinting process 300 can be further improved if the one or both of Y-offset $O_y$ and the X-offset $O_x$ are also adjusted in view of the set of target variable DEE parameters. FIG. 4D illustrates how changing the offset Y-offset $O_y$ changes a first portion of a drop pattern 424c from FIG. 4C into a first portion of a refined drop pattern 424d. The applicant has developed a refinement method of determining these offsets based on the set of target variable DEE parameters which is then used to adjust the drop pattern 424a.

The set of target variable DEE parameters may be determined based on experiments and/or simulations. A DEE study may include performing the imprinting process 300 using the same imprinting conditions with the same template 108 while varying a straight line test DEE relative to the imprint field edges 430. For example, a set of straight line test DEE may include: {250, 245, 240, 235, . . . 150 µm}. Once the plurality of imprint fields have been imprinted with the set of straight line test DEE the imprinted fields are inspected for non-fill defects and extrusion defects along the imprint field edge 430. A desired DEE at each location along the imprint field edge 430 is the largest distance (test DEE) from the imprint field edge in which we have complete filling without any unfilled spot, or in which the statistical likelihood of non-fill defects occurring is at a minimum.

The density of drops in the drop pattern varies across the imprint field. The applicant has found it useful to use drop patterns that include subpatterns that have some intrinsic order as illustrated in FIG. 4B. Four subpatterns $424b_1$, $424b_2$, $424b_3$, and $424b_4$ are illustrated in FIG. 4B. FIG. 4B also shows a chart illustrating a relative value (as an asterisk) of the drop pitch $P_{y,drop,T}(x)$ in the y direction for the drop pattern 424 for each row of drops near the top of the imprint field edge as a function of position (x) along the top of the imprint field edge. The drop pitch is an integer multiple of the dispensable pitch. For example, the drop pitch $P_{y,drop,T}(x)$ for the subpattern $424b_1$ illustrated in FIG. 4B is twice the dispensable pitch Y-pitch $P_y$. For example, the drop pitch $P_{y,drop,T}(x)$ for the subpattern $424b_2$ illustrated in FIG. 4B is four times the dispensable pitch Y-pitch $P_y$. For example, the drop pitch $P_{y,drop,T}(x)$ for the subpattern $424b_3$ illustrated in FIG. 4B is equal to the dispensable pitch Y-pitch $P_y$. For example, the drop pitch $P_{y,drop,T}(x)$ for the subpattern $424b_4$ illustrated in FIG. 4B is twice the dispensable pitch Y-pitch $P_y$. For example, the drop pitch $P_{x,drop,R}(y)$ along the right hand side of the imprint field for the subpattern $424b_4$ illustrated in FIG. 4B is equal to the dispensable pitch X-pitch $P_x$. Note that the drop in the x direction does not have to be equal to the drop pitch in the y direction. Note also that it is the drop pitch in the direction perpendicular to the imprint field edge and next to the imprint field edge which is a parameter of interest for the method described below. FIG. 4B also includes a plot illustrating the drop pitch as function of position along the imprint field edge. Note, that some rows do not have drops near the imprint field edge in which case the drop pitch at that location is not a number (NaN).

Figure 5A:
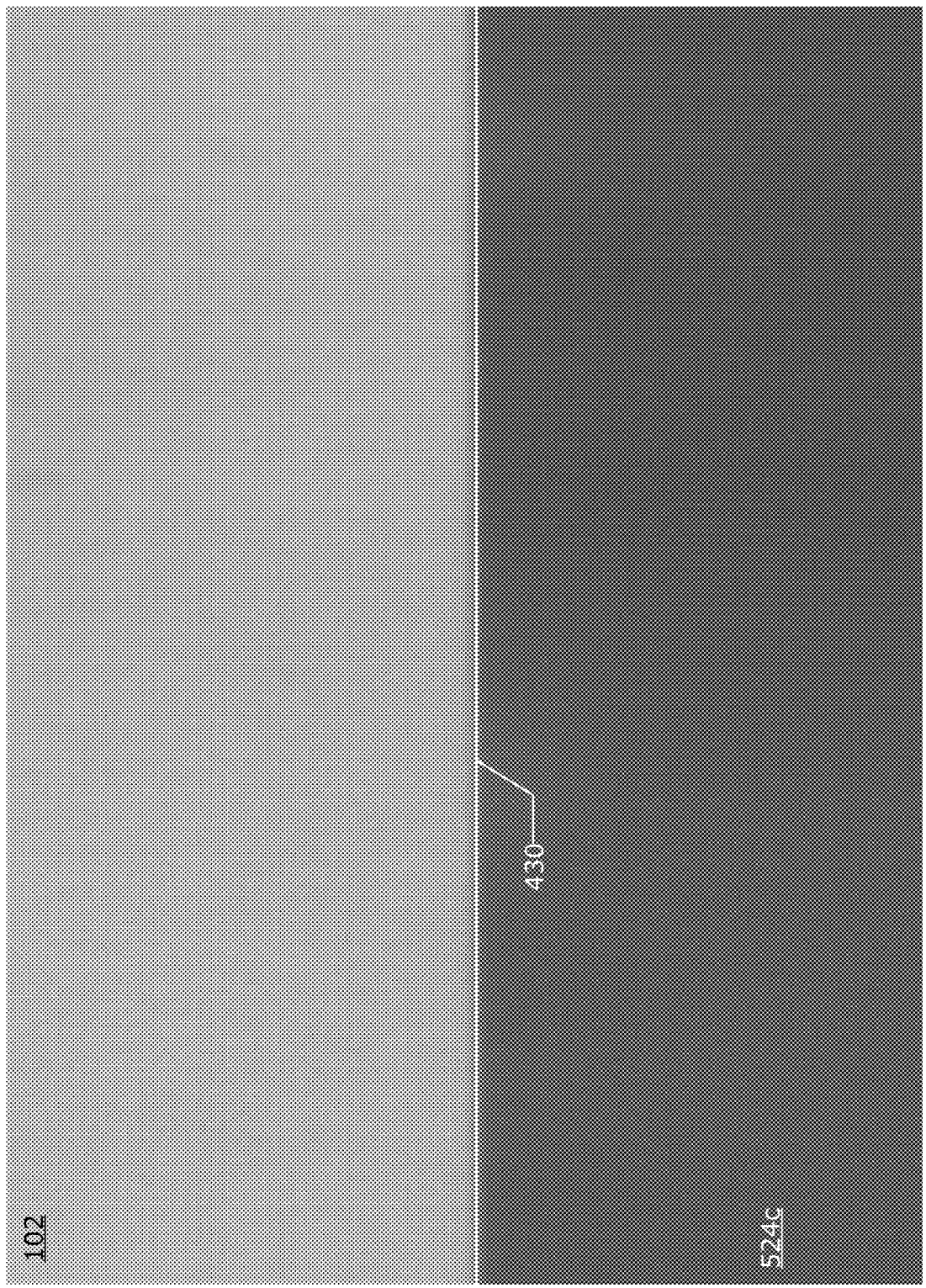
FIGS. 5A-C are micrographs of cured formable material at imprint field edges.
Figure 5B:
Figure 5C:
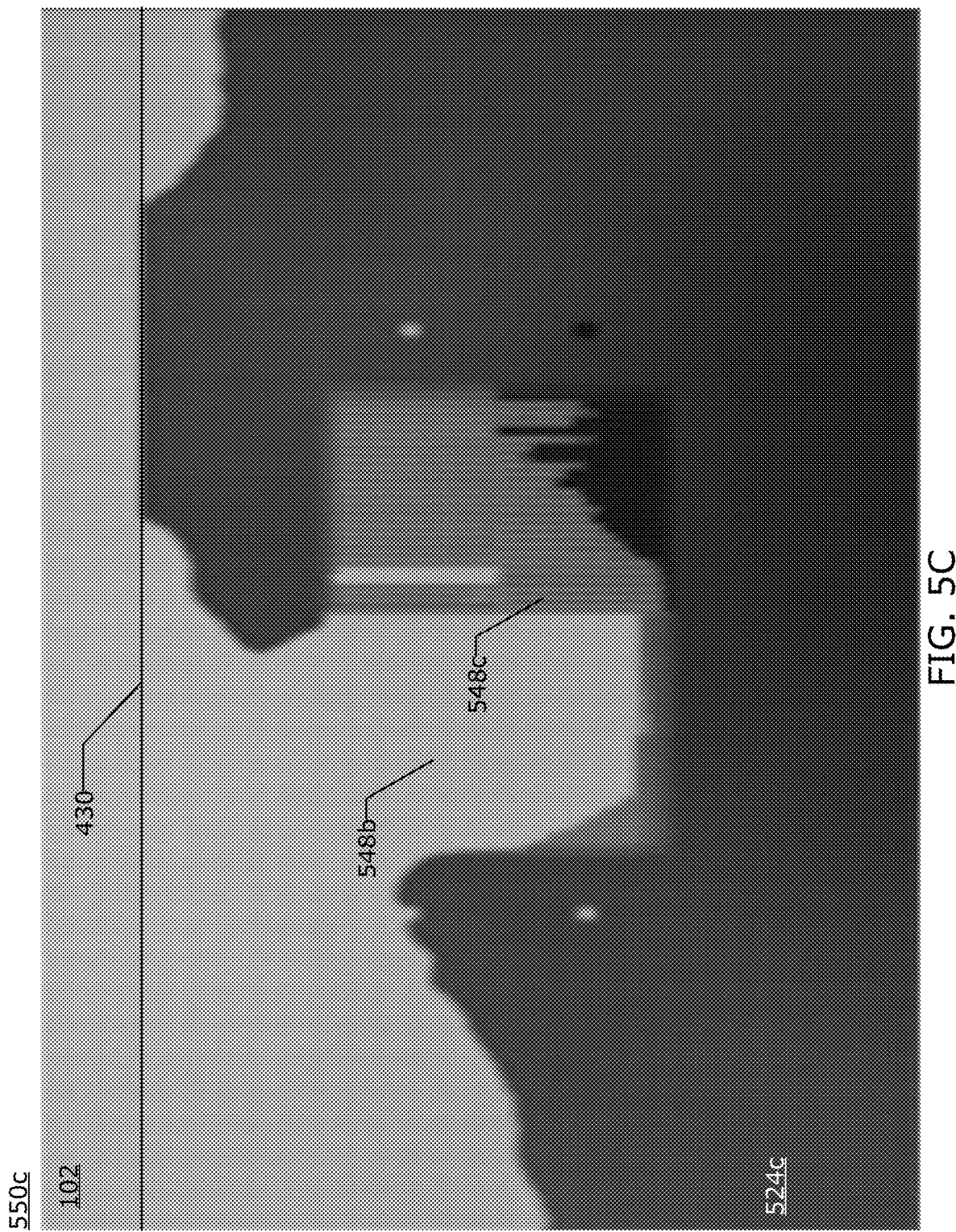

The statistical occurrence of defects near the imprint field edge 430 may be determined by obtaining a micrographs 550 such as those illustrated in FIGS. 5A-C. Micrograph 550a in FIG. 5A of a cured formable material 524c near the imprint field edge 430 on a substrate 102 with no defects. Micrograph 550b in FIG. 5B of a cured formable material 524c near the imprint field edge 430 on a substrate 102 with an extrusion defect 548a. Micrograph 550c in FIG. 5C of a cured formable material 524c on a substrate 102 with a non-fill defect 548b near and alignment mark 548c and the imprint field edge 430. One or more micrographs 550 may be analyzed to identify extrusion defects 548a and non-fill defects 548b. These micrographs 550 may be analyzed using machine vision, by an operator or by a combination of both.

Drop Pattern Refinement Process

Figure 6A:
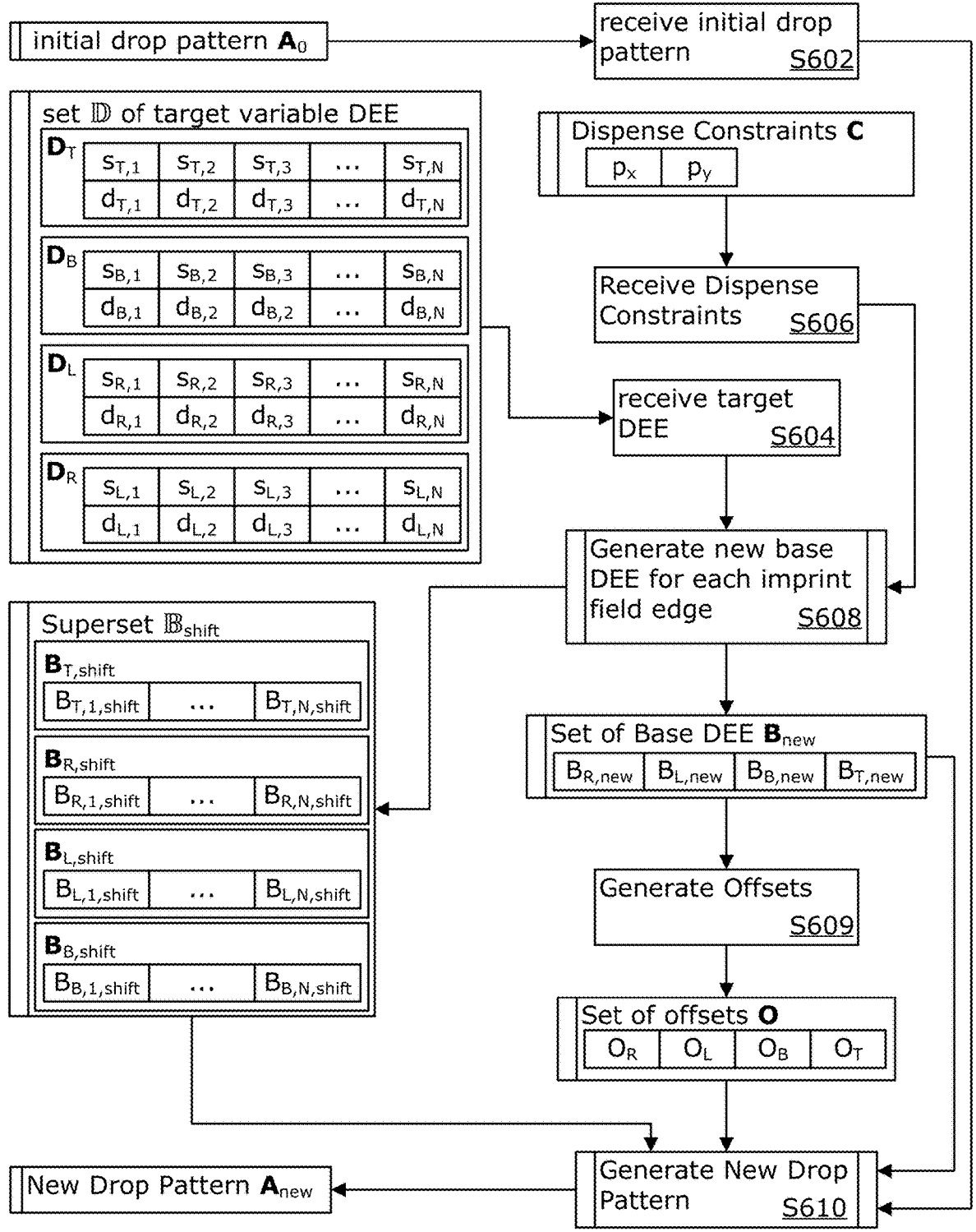
FIGS. 6A-D are flowcharts illustrating a drop pattern refinement process as used in embodiments.

The applicant has developed a drop pattern refinement process 600 illustrated in FIG. 6A. The drop pattern refinement process 600 may include a drop pattern receiving step S602 in which the processor 140 or the networked computer 140a receives an initial drop pattern $A_0$ (note bolded characters are used in reference to sets including arrays and vectors). The initial drop pattern $A_0$ may take the form of one or more of: an image file; a list of drop locations; a list of dispensing parameters; and an entry in a database. In an embodiment, the GUI 141 may include an interface for entering the initial drop pattern $A_0$.

The drop pattern refinement process 600 may include a target DEE receiving step S604 in which the processor 140 or the networked computer 140a receives a set $\mathbb{D}$ of variable target DEE (note double-struck characters are used in reference to sets of sets or supersets). The DEE set $\mathbb{D}$ includes one or more subsets of target DEE one for each imprint field edge. For example, for rectilinear imprint field the DEE set $\mathbb{D}$ may include: a top DEE subset $D_T$; a bottom DEE subset $D_B$; a left DEE subset $D_L$; and a right DEE subset $D_R$. Each of the DEE subsets $D_j$ for imprint field edge j (j∈{T,B,R,L}) has a list of positions ($s_j$) and a list of DEE distances ($d_j$) associated. Note, that in the following the letters (T,B,R, and L) are in reference to one of the imprint field edges (top, bottom, right, and left) only when they are used as subscripts, when not used as subscripts they are not in reference to imprint field edges. The top DEE subset $D_T$ may include N top-side positions $s_{T,i}$ at which a target DEE $d_{T,i}$ was determined. The bottom DEE subset $D_B$ may include N bottom-side positions $s_{B,i}$ at which a target DEE $d_{B,i}$ was determined. The right DEE subset $D_R$ may include N right-side positions $s_{R,i}$ at which a target DEE $d_{R,i}$ was determined. The left DEE subset $D_L$ may include N left-side positions $s_{L,i}$ at which a target DEE $d_{L,i}$ was determined. In an embodiment, each of the subsets $D_j$ has a different number $N_j$ of positions. The DEE set $\mathbb{D}$ may take the form of one or more of: a file; a dataset in a database; and information entered via the GUI 141.

The drop pattern refinement process 600 may include a dispense constraints receiving step S606 in which the processor 140 or the networked computer 140a receives a set of C of dispense constraints. The set of dispense constraints C may include: dispensable X-pitch $P_x$; and dispensable Y-pitch $P_y$. The set of dispense constraints C may take the form of one or more of: a file; and a dataset in a database; and information entered via the GUI 141. In an alternative embodiment, one or more of the set of dispense constraints C may be calculated based on other parameters, such as fluid dispenser model number; fluid dispenser serial number; number of passes; fly height of the fluid dispenser above the substrate; translation speed of the fluid dispenser 112 relative to the substrate 102; clock rate used for the fluid dispenser control circuit; clock multiplier used for the fluid dispenser control circuit; etc.

The drop pattern refinement process 600 may include a base DEE generation subprocess S608 in which the processor 140 or the networked computer 140a generates a new base DEE $B_{j,new}$ for one or more of the imprint field edges using the set of dispense constraints C and the DEE set $\mathbb{D}$ and finding drop shifts $B_{j,i,shift}$ at each position $s_{j,i}$ forming a set of drop shifts $B_{j,shift}$ for each imprint field edge j and superset of drops shifts $\mathbb{B}_{shift}$ including the sets of drop shifts $B_{j,shift}$ for all the imprint field edges. The new base DEE $B_{j,new}$ for the imprint field edges may also be used to generate a set of offsets O in an optional offset determination step S609. The set of offsets O may include an offset for each imprint field edge (O={right side dispense position offset $O_{R,x}$, left side dispense position offset $O_{L,x}$, bottom side dispense position offset $O_{B,y}$, top side dispense position offset $O_{T,y}$}). The offset determination step S609 may include determining how much to move an origin of a grid of dispensable positions such that drops are dispensed on the new base DEE $B_{j,new}$ and positions offset from the new base DEE $B_{j,new}$. Note that there are two origins for each axis, one for each imprint field edge this may be accomplished by dispensing with multiple passes as described by U.S. Pat. No. 10,634,993-B2 which is hereby incorporated by reference. In an alternative embodiment, the origin and pitch perpendicular to the row of dispense nozzles may be adjusted such that drops are dispensed on two new Base DEEs parallel to the row of dispense nozzles.

The drop pattern refinement process 600 may include a new drop pattern generation subprocess S610 in which the processor 140 or the networked computer 140a generates a new drop pattern $A_{newt}$ using the set of offsets O, drop shifts (set of intermediate values $H_{j,k}$) or the new DEE (set of drop displacements $F_{j,output}$) and the initial drop pattern $A_0$.

Process for Generating Base DEE

Figure 6B:
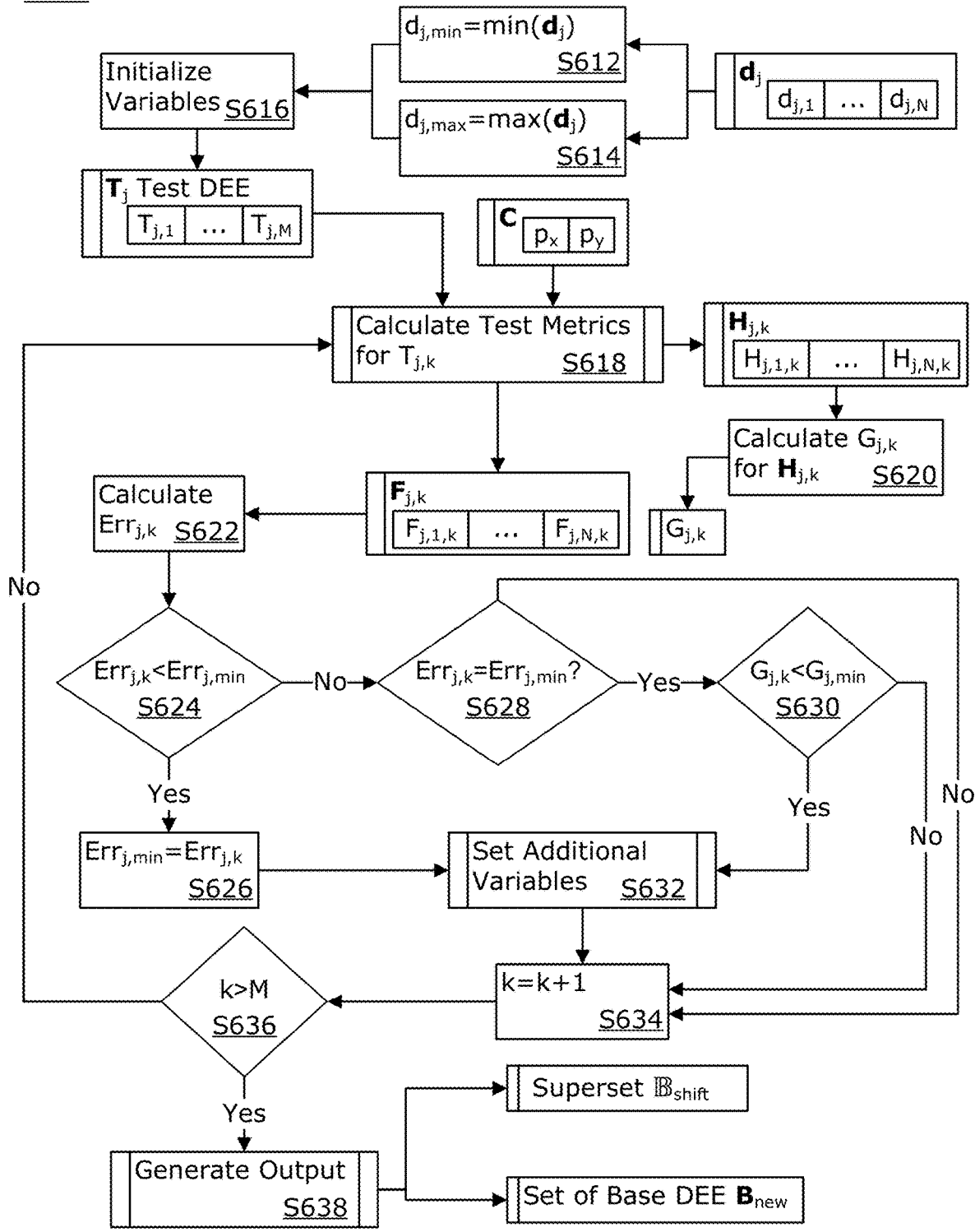

An exemplary method of performing the base DEE generation subprocess S608 is illustrated by the flowchart in FIG. 6B for each imprint field edge j. For each imprint field edge j there is a subset $D_j$ of the DEE set $\mathbb{D}$. The subset $D_j$ includes the set of positions $s_j$, the set of DEE offsets $d_j$ and the number of elements $N_j$ in the set of DEE offsets $d_j$ for each imprint field edge j. The set of DEE offsets $d_j$ may be empirically determined. In an embodiment, each imprint field edge j has the same number of elements N. The set of DEE offsets $d_j$ includes $N_j$ elements of the DEE offset $d_{j,i}$. Each DEE offset $d_{j,i}$ is a desired offset at position $s_{j,i}$ on imprint field edge j. Each DEE offset $d_{j,i}$ may be based one or more experimental imprints as described above.

When the base DEE generation subprocess S608 is being performed for the top imprint field edge and the bottom imprint field edge then the dispensable Y-pitch $P_y$ may be used. When the base DEE generation subprocess S608 is being performed for the left imprint field edge and the right imprint field edge then the dispensable X-pitch $P_x$ may be used.

The base DEE generation subprocess S608 may include a determining minimum DEE calculation step S612 by determining a minimum DEE value $d_{j,min}$ for the imprint field edge j in the set $d_j$. The base DEE generation subprocess S608 may include a determining maximum DEE calculation step S614 by determining a maximum DEE value $d_{j,max}$ for the imprint field edge j in the set $d_j$.

The base DEE generation subprocess S608 may include determining a best fit base DEE. The best fit base DEE takes advantage of the ability of the positioning system to adjust offsets of the set of potential drop locations 452a relative to imprint field edge 430. The best fit base DEE is adjusted such that that droplets at an edge of a drop pattern are located on the base DEE or some integer pitch multiple from the base DEE.

The drop pattern refinement process 600 may include optimizing the drop pattern in order to minimize the amount of extrusions and non-fill defects. The drop pattern refinement process 600 may include finding an optimum DEE that varies across the imprint field edge for the imprinting process 300 in order to minimize an amount of extrusions of formable material along the imprint field edge 430. The drop pattern refinement process 600 may calculate a DEE and drop displacement for each location close to the imprint field edge 430. The drop pattern refinement process 600 may minimize a volume of material close to the imprint field edge 430 so as to find an optimum DEE and drop displacement for each location along the imprint field edge.

An output of drop pattern refinement process 600 may include one or more of: an optimum base DEE for each imprint field edge j; a set of drop positions $H_{j,output}$ relative to the optimum base DEE for each position $s_{j,i}$ along imprint field edge j; a set of drop displacements $F_{j,output}$ for each position $s_{j,i}$ along imprint field edge j; and an error metric. In an embodiment, a positive drop displacement means the drop should be moved $H_{j,output} \times (P_x$ or $P_y)$ away the imprint field edge 430. In an embodiment, a negative drop displacement means the drop should move $H_{j,output} \times (P_x$ or $P_y)$ towards the imprint field edge 430. The error metric may be the root mean squared error of a difference between a target DEE and the new DEE.

The base DEE generation subprocess S608 may include an initialization step S616 that is performed for each imprint field edge j. The initialization step S616 may include setting one or more initial variables to zero or a default value. The initial variables may include: a test index k; and other interim variables. The initialization step S616 may also include forming a test set $T_j$ for each edge j. The test set $T_j$ may include a set of M test base DEE $T_{j,k}$ values between the minimum DEE value $d_{j,min}$ and the maximum DEE value $d_{j,max}$ ($\{T_{j,k} \in T_j | d_{j,min} \leq T_{j,k} \leq d_{j,max}\}$). In an alternative embodiment, and a new value for test base DEE $T_{j,k}$ is calculated as needed using a search method. The which are available for the test set $T_j$ is limited by the positioning accuracy of the positioning system which is typically less than the pitches of the dispensing system. The initialization step S616 may also include setting an initial value for $G_{j,min}$ to a very large values such as ∞ or the maximum value allowed for the data type being used for $G_{j,min}$. The initialization step S616 may also include setting an initial value for $Err_{j,min}$ to a very large value such as ∞ or the maximum value allowed for the data type being used for $Err_{j,min}$.

In an embodiment, the set of potential drop locations 452a is limited by the set of dispense constraints C (dispensable X-pitch $P_x$, dispensable Y-pitch $P_y$) which can be for example on the order of 35 μm. In an embodiment, the set of potential drop locations 452a may be adjusted by adjusting the offsets (Y-offset $O_y$, X-offset $O_x$). In an embodiment, the base DEE generation subprocess S608 includes trying a plurality of test base DEE $T_{j,k}$ in order to identify suitable offsets for each imprint field edge j.

The base DEE generation subprocess S608 may include a test metric calculation subprocess S618 in which each of the plurality of test base DEE $d_{test,k}$ are evaluated. In an embodiment, equation (1) may be used to calculate an intermediate value $H_{j,i,k}$ which is a series of values that may be used as the number of integer steps that drop should be moved closer or farther from the edge. The intermediate value $H_{j,i,k}$ represents an impact of a particular test base DEE $T_{j,k}$ when the pitch is taken into account for each imprint field edge j. The set of intermediate value $H_{j,k}$ is all intermediate values associated with the set of positions $s_j$ for imprint field edge j and the test base DEE $T_{j,k}$.

$$H_{j,i,k} = \begin{cases} \left\lfloor \dfrac{d_{j,i} - T_{j,k}}{p_y} \right\rfloor, & ((T_{j,k} \leq d_{j,i}) \wedge (j \in \{T, B\})) \\ -\left\lfloor \dfrac{T_{j,k} - d_{j,i} - 1}{p_y} \right\rfloor - 1, & ((T_{j,k} > d_{j,i}) \wedge (j \in \{T, B\})) \\ \left\lfloor \dfrac{d_{j,i} - T_{j,k}}{p_x} \right\rfloor, & ((T_{j,k} \leq d_{j,i}) \wedge (j \in \{R, L\})) \\ -\left\lfloor \dfrac{T_{j,k} - d_{j,i} - 1}{p_x} \right\rfloor - 1, & ((T_{j,k} > d_{j,i}) \wedge (j \in \{R, L\})) \end{cases} \quad (1)$$

Equations (2) describe how a test metric $F_{j,i,k}$ may be calculated which represents an impact of a particular test base DEE $T_{j,k}$ when the pitch is taken into account for each imprint field edge j. The test metric $F_{j,i,k}$ is calculated for each of DEE offset $d_{j,i}$ and each test base DEE $T_{j,k}$.

$$F_{j,i,k} = \begin{cases} T_{j,k} + p_y \left\lfloor \dfrac{d_{j,i} - T_{j,k}}{p_y} \right\rfloor, & ((T_{j,k} \leq d_{j,i}) \wedge (j \in \{T, B\})) \\ T_{j,k} - p_y \left\lfloor \dfrac{T_{j,k} - d_{j,i} - 1}{p_y} \right\rfloor - p_y, & ((T_{j,k} > d_{j,i}) \wedge (j \in \{T, B\})) \\ T_{j,k} + p_x \left\lfloor \dfrac{d_{j,i} - T_{j,k}}{p_x} \right\rfloor, & ((T_{j,k} \leq d_{j,i}) \wedge (j \in \{R, L\})) \\ T_{j,k} - p_x \left\lfloor \dfrac{T_{j,k} - d_{j,i} - 1}{p_x} \right\rfloor - p_x, & ((T_{j,k} > d_{j,i}) \wedge (j \in \{R, L\})) \end{cases} \quad (2)$$

The base DEE generation subprocess S608 may include a summation step S620 of determining a second metric $G_{j,k}$ by summing the absolute value of test metric $H_{j,i,k}$ over the position index i of all the positions $s_{j,i}$ as described by equation (3). The applicant has found that the second metric $G_{j,k}$ is useful for identifying specific solutions along with other metrics if and when the other metrics don't provide a unique solution.

$$G_{j,k} = \sum_{i}^{N_j} |H_{j,i,k}| \quad (3)$$

The base DEE generation subprocess S608 may include an error calculation step S622 of determining an error for imprint field edge j and test base $T_{j,k}$ ($Err_{j,k}$) by summing a square of a difference between the test metric $F_{j,i,k}$ and the DEE offset $d_{j,i}$ over the position index i as described in equation (4). The error $Err_{j,k}$ is a quantitative measure of a quality of the test base DEE $T_{j,k}$. The lower the $Err_{j,k}$ the better the test base DEE $T_{j,k}$.

$$Err_{j,k} = \sum_{i}^{N_j} (d_{j,i} - F_{j,i,k})^2 \quad (4)$$

The base DEE generation subprocess S608 may include a first error test step S624. The first error test step S624 may include comparing the error $Err_{j,k}$ for test base DEE $T_{j,k}$ to a test parameter such as the minimum error $Err_{j,min}$. The minimum error $Err_{j,min}$ may be set to an initial value which may then be adjusted during base DEE generation subprocess S608. In the case where the error $Err_{j,k}$ is less than the minimum error $Err_{j,min}$ then the process moves onto an error assignment step S626. During the error assignment step S626 the error $Err_{j,k}$ is assigned to the minimum error $Err_{j,min}$. After the error assignment step S626 a variable setting subprocess S632 is performed, which will be described below.

After the variable setting subprocess S632 is performed the test index k is incremented in an incrementing step S634. After the incrementing step S634 an index testing step S636 is performed in which the test index k is compared to the size M of the test set $T_j$. In the case where the test index k is less than or equal to the size M of the test set $T_j$ then the process moves back to the test metric calculation subprocess S618. In the case where the test index k is not less than the size M of the test set $T_j$ then the process moves onto a generating output subprocess S638, which will be described below.

In an alternative embodiment, there is no test index k and a test base DEE $T_j$ is recalculated during each loop. In an embodiment, the test base DEE $T_j$ is varied in a linear manner from the minimum DEE value $d_{j,min}$ to the maximum DEE value $d_{j,max}$. In an embodiment, an iterative search is used with a diminishing step size to try different test base DEE $T_j$. In an alternative embodiment, an adaptive step size search is used to try different test base DEE $T_j$. In an alternative embodiment, a Monte Carlo minimization method is used to try initial different test base DEE $T_j$ along with a minimization search routine.

In an embodiment, the index testing step S636 is replaced with a general testing step S636a in which the test base DEE $T_j$ is compared to check to see if the value is in or out of the test range. In an alternative embodiment, the index testing step S636 is replaced with a metric testing step S636b in which the minimum error $Err_{j,min}$ is compared to a reference value. In an alternative embodiment, the index testing step S636 is replaced with a loop count test S636c in which the number loops are within a certain range. In an alternative embodiment, different testing steps are combined.

After the first error test step S624, in the case where the error $Err_{j,k}$ is not less than the minimum error $Err_{j,min}$ then the process moves onto a second error test step S628. The second error test step S628 includes determining if the error $Err_{j,k}$ is equal to the minimum error $Err_{j,min}$. In the case where the error $Err_{j,k}$ is not equal to the minimum error $Err_{j,min}$ then the process moves onto the incrementing step S634. In the case where the error $Err_{j,k}$ is equal to the minimum error $Err_{j,min}$ then the process moves onto the third error test step S630.

The third error test step S630 may include comparing the second metric $G_{j,k}$ for test base DEE $T_{j,k}$ to a test parameter such as the minimum second metric $G_{j,min}$. In the case where the second metric $G_{j,k}$ is not less than a test parameter (for example $G_{j,min}$) then the process moves onto the incrementing step S634. In the case where the second metric $G_{j,k}$ is less than a test parameter (for example $G_{j,min}$) then the process moves onto the variable setting subprocess S632.

Variable Setting Subprocess

Figure 6C:
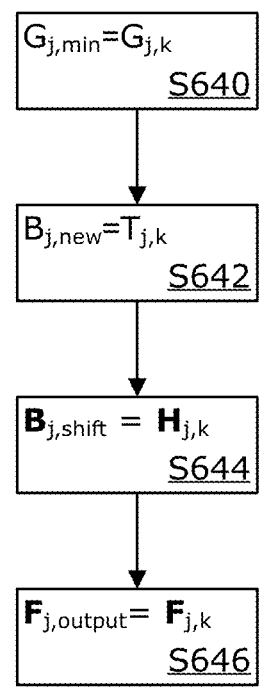

FIG. 6C is an illustration of a variable setting subprocess S632 as may be performed in an embodiment. The variable setting subprocess S632 may include a second error assignment step S640 in which the test parameter $G_{j,min}$ is set to the second metric $G_{j,k}$ for test base DEE $T_{j,k}$ and imprint field edge j. The variable setting subprocess S632 may include a new base DEE setting step S642 in which the new base DEE $B_{j,new}$ is set to the test base DEE $T_{j,k}$ for the imprint field edge j. The variable setting subprocess S632 may include drop shifts setting step S644 in which the set of drop shifts $\mathbb{B}_{j,shift}$ is set to set of intermediate values $H_{j,k}$ for imprint field edge j. The variable setting subprocess S632 may include an output drop displacement setting step S646 in which the set of drop displacements $F_{j,output}$ is set to the set of test metrics $F_{j,k}$ for test base DEE $T_{j,k}$ and imprint field edge j.

Generating Output Subprocess

The drop pattern refinement process 600 may include a generating output subprocess S638. The generating output subprocess S638 may include presenting to the user for each imprint field edge j one or more of: a set of base DEE $B_{new}$; the superset of drop shifts $\mathbb{B}_{shift}$; the set of drop displacements $F_{j,output}$; and the minimum error $Err_{j,min}$ or a function of the minimum error $Err_{j,min}$. The function of minimum error $Err_{j,min}$ may be an RMS error ($Err_{j,RMS}$) determined by dividing the minimum error $Err_{j,min}$ by the number of elements $N_j$ and taking the square root of that quotient as described by equation (5) below.

$$Err_{j,RMS} = \sqrt{\frac{Err_{j,min}}{N_j}} \quad (5)$$

New Drop Pattern Generation Subprocess

Figure 6D:
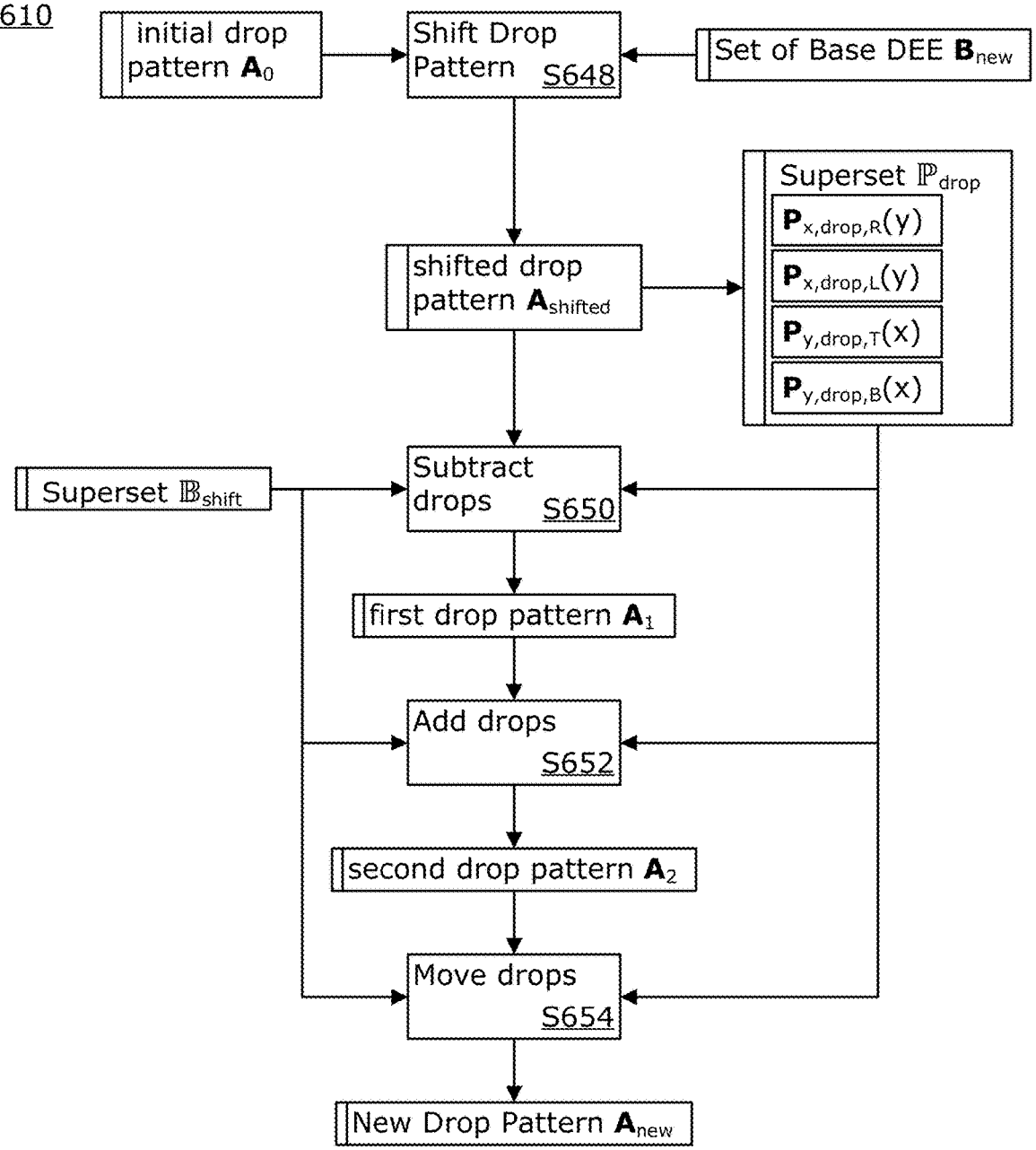

FIG. 6D is an illustration of an exemplary embodiment of the new drop pattern generation subprocess S610. The new drop pattern generation subprocess S610 may include the steps of: a shifting drops step S648 of the initial drop pattern $A_0$ to form a shifted drop pattern; subtracting drops in a subtracting drop step S650 to the shifted drop pattern $A_{shifted}$ to form a first drop pattern $A_1$; adding drops from the first drop pattern $A_1$ to form a second drop pattern $A_2$ in an adding drops step S652; and moving drops in the second drop pattern $A_1$ to form the new drop pattern $A_{new}$ in an moving drops step S654. In an embodiment, the new drop pattern $A_{new}$ is then used in the dispensing step S302 of the imprinting process 300.

The shifting drops step S648 may include shifting all the drops in the initial drop pattern $A_0$ such that drops closest to imprint field edge j land on the new base DEE $B_{j,new}$. This may be accomplished by changing the offset of the potential drop locations such that one or more drops that are close to the imprint field edge of the initial drop pattern $A_0$ are on the new base DEE $B_{j,new}$. For example, in FIG. 4C illustrates an initial drop pattern $A_0$ (424c) in which an initial base DEE $B_{T,initial}$ is 84 μm and top side dispense position offset $O_{T,y}$ of initial set of potential drop locations from the top imprint field edge is 14 μm. FIG. 4D illustrates how the initial drop pattern $A_0$ (424c) in which an initial base DEE $B_{T,shifted}$ (454b) is 94 μm and top side dispense position offset $O_{T,y}$ of shifted set of potential drop locations from the top imprint field edge (430) is 24 μm.

The subtracting drops step 650 includes determining if a drop should be removed from the shifted drop pattern $A_{shifted}$ based on the superset of drop shifts $\mathbb{B}_{shift}$ and a superset of drop pitches $\mathbb{P}_{drop}$ to form a first drop pattern $A_1$. Drops in the shifted drop pattern $A_{shifted}$ are removed if they are positioned between the shifted base DEE parallel to an imprint field and the imprint field edge to form the first drop pattern $A_1$.

The adding drops step 652 includes determining if drops should be added to the first drop pattern $A_1$ based on the superset of drop shifts $\mathbb{B}_{shift}$ and a superset of drop pitches $\mathbb{P}_{drop}$ to form a second drop pattern $A_2$. In an embodiment, the drop shift is determined at a limited set of positions $s_j$ while the drop pattern is determined at each potential drop location, the drop shift that is used would be at the position $s_{j,i}$ that is closest to the row or column of drops being tested. The drops are added to the drop pattern on the local drop pitch at the relevant row or column until the shifted base DEE is reached at the set of drop displacements $F_{j,output}$. Drops are not added to the drop pattern that are outside the base DEE and the locally shifted base DEE. In an alternative embodiment, the drop pattern is made up of subpatterns and subpattern are added instead of each column.

The moving drops step 652 may include determining if drops in the second drop pattern $A_2$ should be moved based on the superset of drop shifts $\mathbb{B}_{shift}$ and a superset of drop pitches $\mathbb{P}_{drop}$ to form the new drop pattern $A_{new}$. In an embodiment, the drop shift is determined at a limited set of positions $s_j$ while the drop pattern is determined at each potential drop location, the drop shift in the set of drop shifts $B_{j,shift}$ is the one closest to that row or column of drops being tested. Moving the drops includes moving a subset of drops that are near the edge of the drop pattern on the shifted base DEE such that the drops land on the shifted drop displacements $F_{j,output}$. Drops near the shifted base DEE are moved to be on the shifted base DEE. In an embodiment, the drop that are shifted are the $N_{drops}$ (1, 2, 3, 5, 7) drops in a column or row perpendicular to imprint field edge. In an embodiment, in the moving drops step may include identifying one or more shiftable locations on in the second drop pattern $A_2$ on the shifted drop displacements $F_{j,output}$ without drops. Once a shiftable locations is identified, then drops that are less than a local drop pitch in a direction perpendicular to the imprint field are shifted to be on the on the shifted drop displacements $F_{j,output}$. This may be performed on a row, column, or subpattern basis.

Example

Figure 7A:
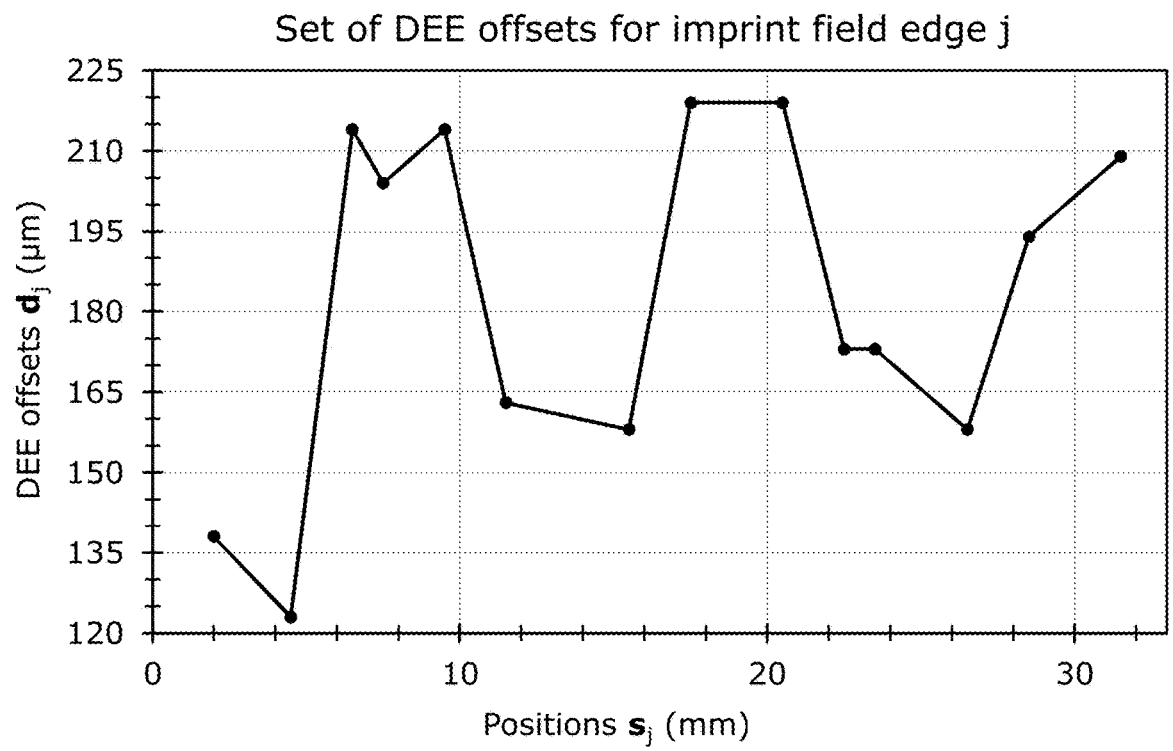
FIGS. 7A-F are charts illustrating information used during the drop pattern refinement process as used in embodiments.
Figure 7F:
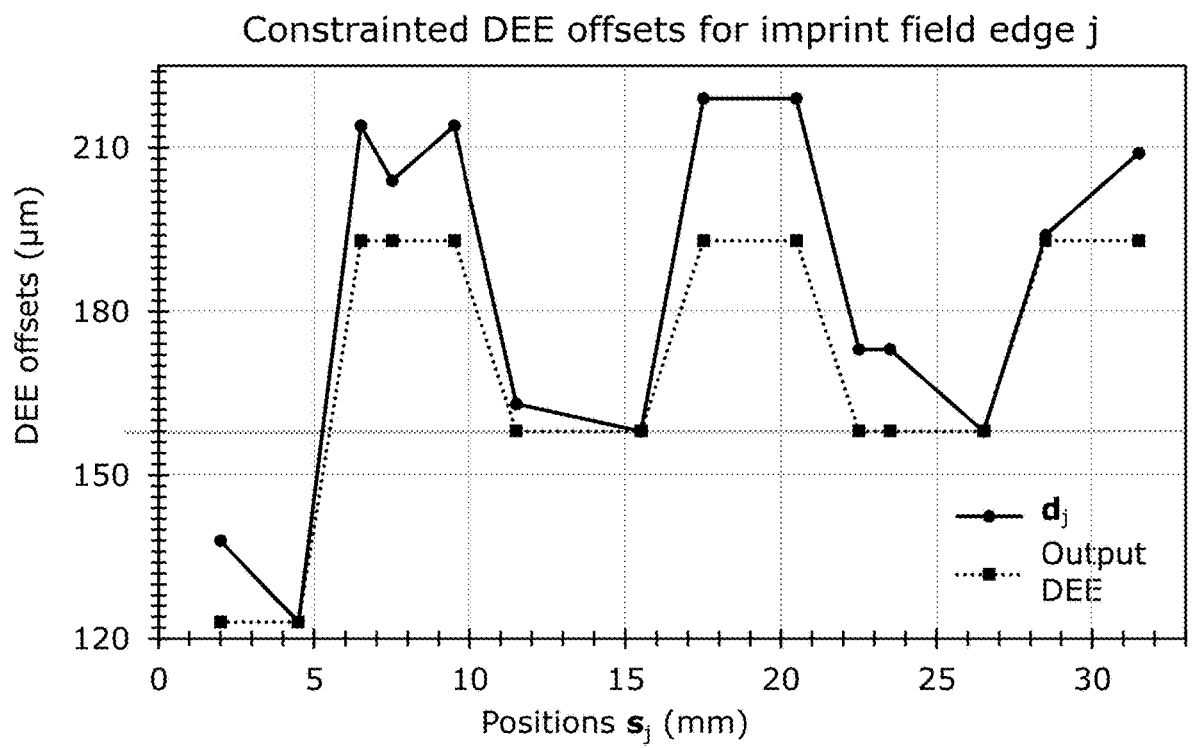
Figure 7B:
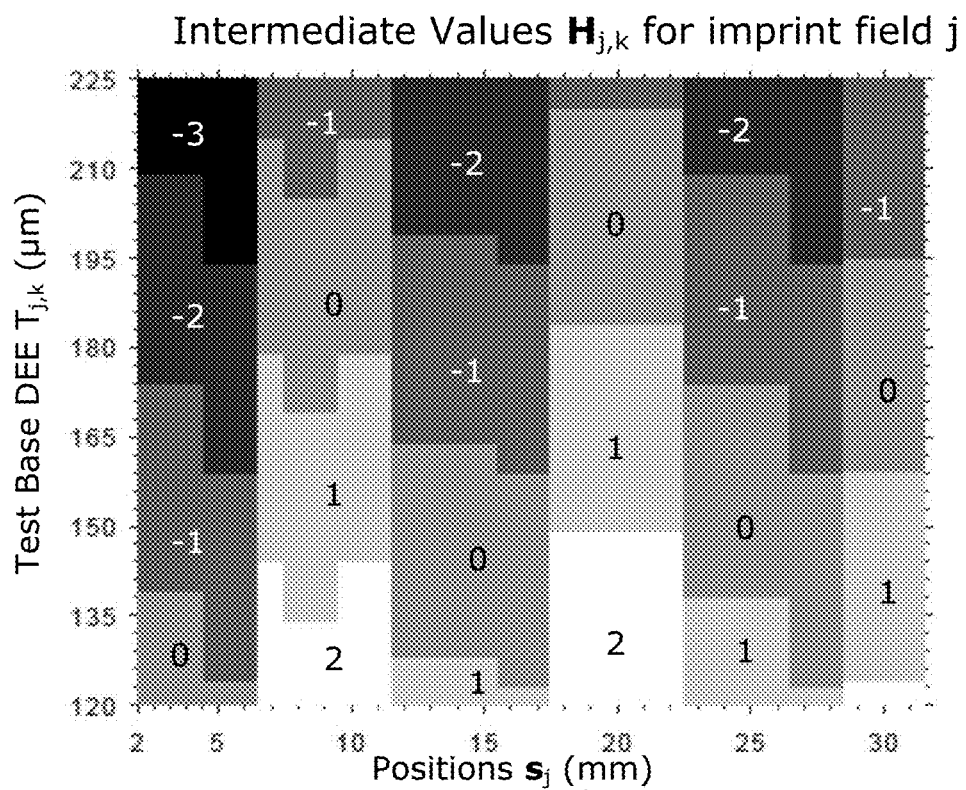
Figure 7C:
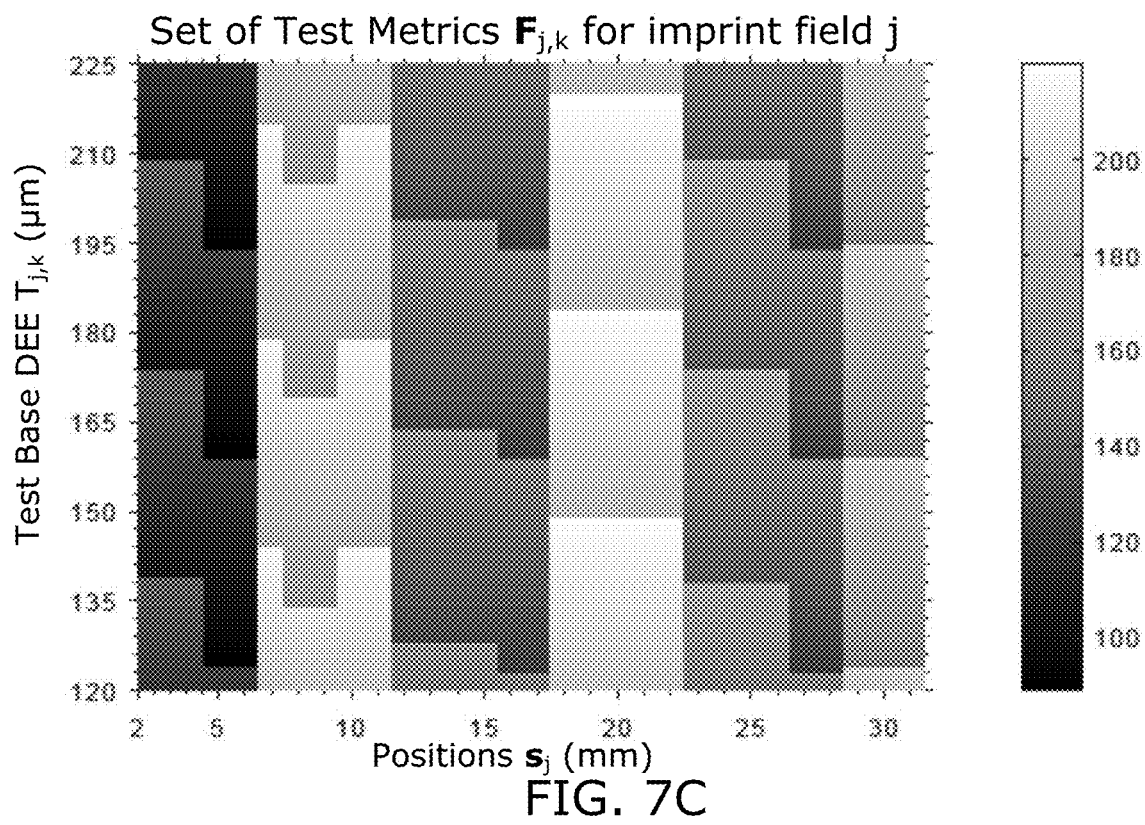
Figure 7D:
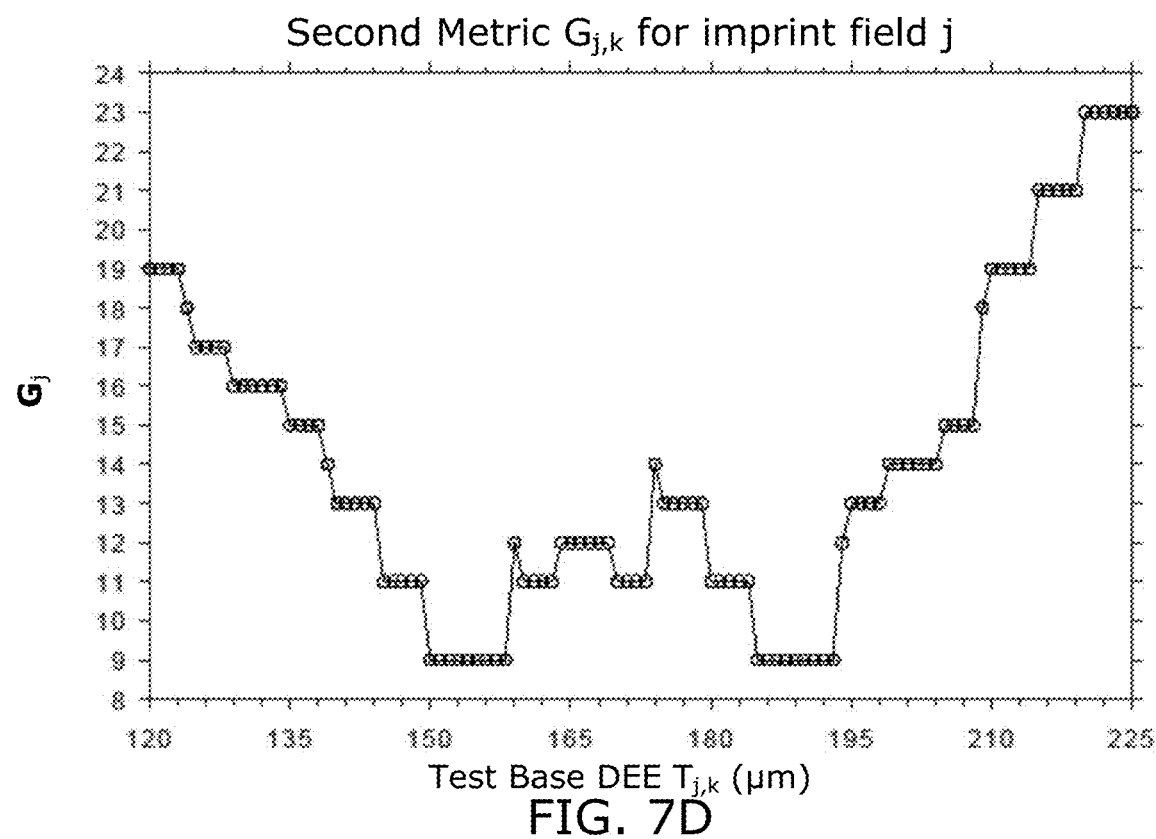
Figure 7E:
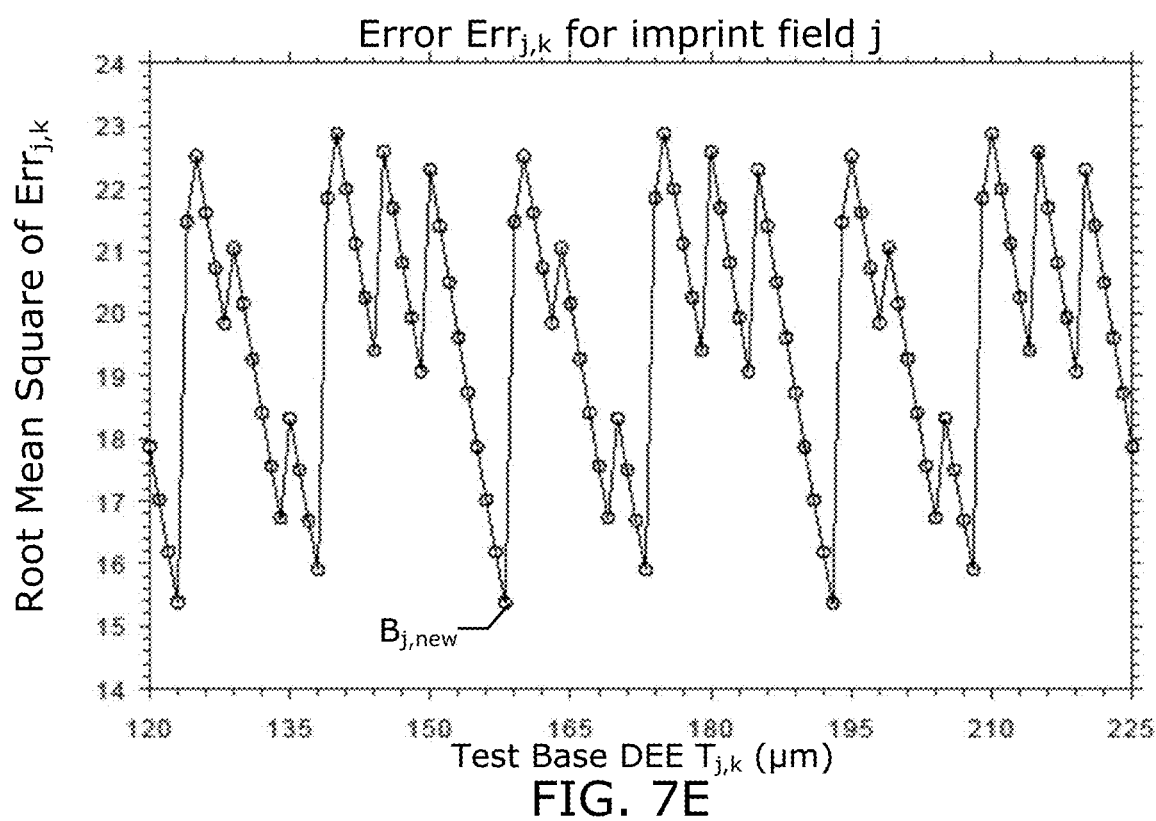

FIG. 7A is a chart illustrating an exemplary set of DEE offsets $d_j$ which may be used in an embodiment. This exemplary set of DEE offsets were generated by examining extrusions and non-fill defects on plurality of imprinted fields on test wafers, they are the maximum DEE offsets in which the imprint field is filled without non-fill defects at the imprint field edge 430. FIG. 7B is a chart illustrating the set of intermediate values $H_{j,k}$ that were calculated based on the exemplary set of DEE offsets $d_j$ in FIG. 7A for a set of test base DEE $T_{j,k}$. FIG. 7C is a chart illustrating the set of test metrics $F_{j,k}$ that were calculated based on the exemplary set of DEE offsets $d_j$ in FIG. 7A for a set of test base DEE $T_j$. FIG. 7D is a chart illustrating a set of second metrics $G_j$ that were calculated based on the exemplary set of DEE offsets $d_j$ in FIG. 7A for a set of test base DEE $T_j$. FIG. 7E is a chart illustrating the root mean square of the error $Err_{j,k}$ that were calculated based on the exemplary set of DEE offsets $d_j$ in FIG. 7A for a set of test base DEE $T_j$. FIG. 7F is an output DEE that varies with position that has been optimized to take the pitch constraints into account.

Figure 8A:
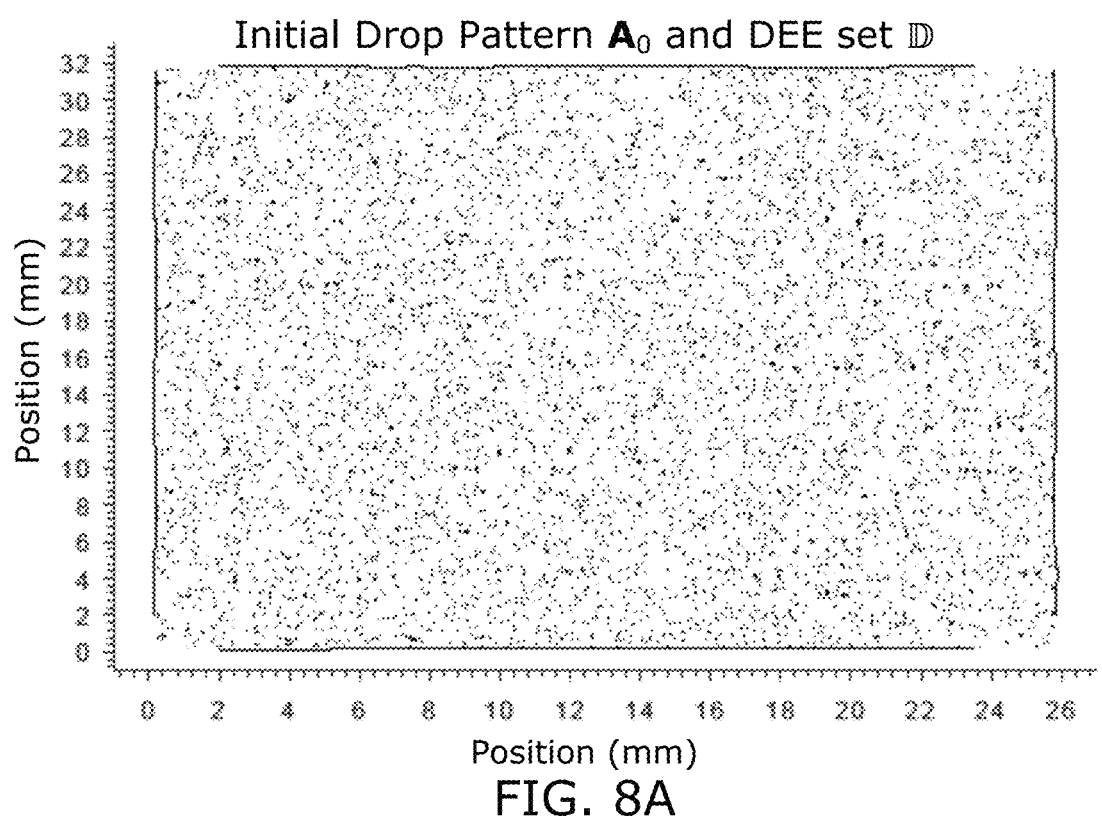
FIGS. 8A-H are charts illustrating information and drop patterns used during the drop pattern refinement process as used in embodiments.

FIG. 8A is a scatter plot showing an initial drop pattern $A_0$ and DEE set $\mathbb{D}$. The drop positions are illustrated as dots. The DEE set $\mathbb{D}$ are illustrated as lines. Note that, in an embodiment, the initial drop pattern may be inset within the DEE set $\mathbb{D}$.

Figure 8B:
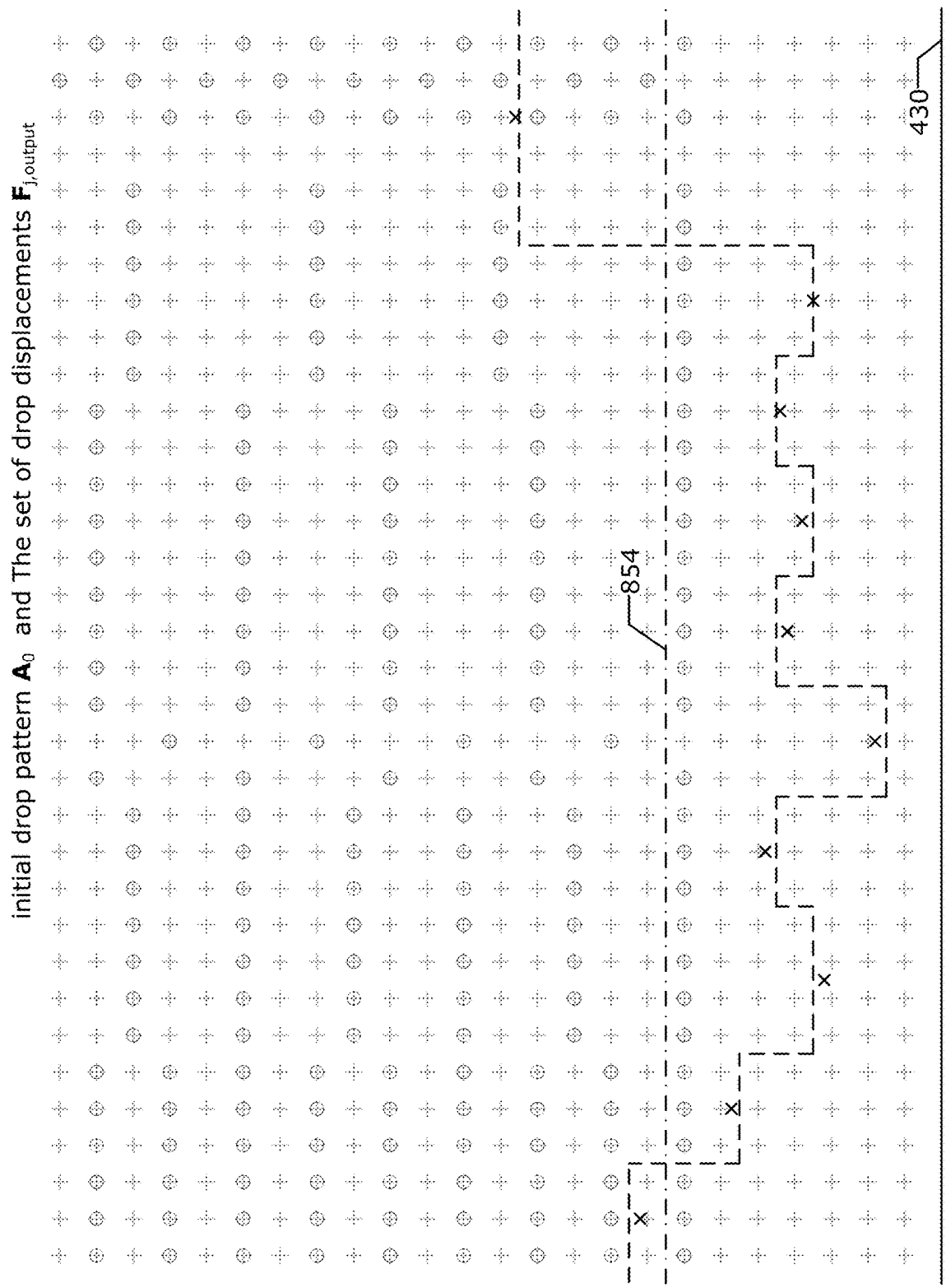

FIG. 8B is an illustration of a portion of the initial drop pattern $A_0$ and a portion of the bottom DEE subset $D_B$. The imprint field edge 430 is illustrated as a dark line. The set of potential drop locations 452a of the initial drop pattern $A_0$ are illustrated as grey crosses which are set on a drop pitch with a zero offset relative to the imprint field edge 430. The drop positions are shown as circles "o". The measured DEE offset ($d_{B,i}$) are shown as "x". The new base DEE for the bottom edge ($B_{B,new}$) 854 is illustrated as a dashed line with dots ".-". The set of drop displacements $F_{j,output}$ is represented by a dashed line.

Figure 8C:
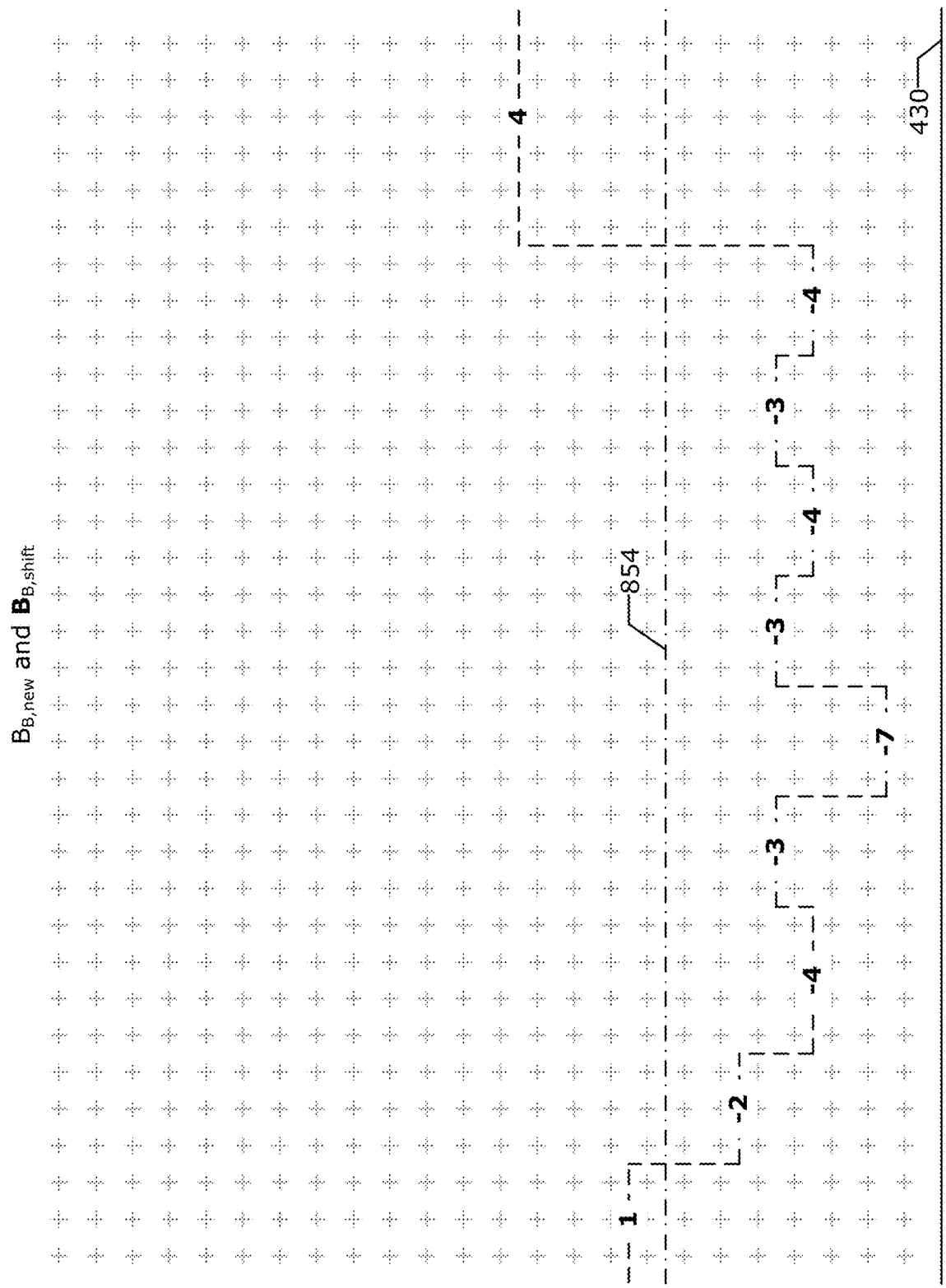

FIG. 8C is an illustration of the new base DEE for the bottom edge ($B_{B,new}$) 854 along with values of a portion of the set of drop shifts $B_{B,shift}$ relative to the imprint field edge 430. Positive values means drops should move away from the imprint field edge 430 relative to the new base DEE. Negative values means drops should move towards the imprint field edge 430 relative to the new base DEE. The value of the set of drop shifts $B_{B,shift}$ is in units (distance between two grey crosses) of the dispensable pitch perpendicular to the imprint field edge.

Figure 8D:
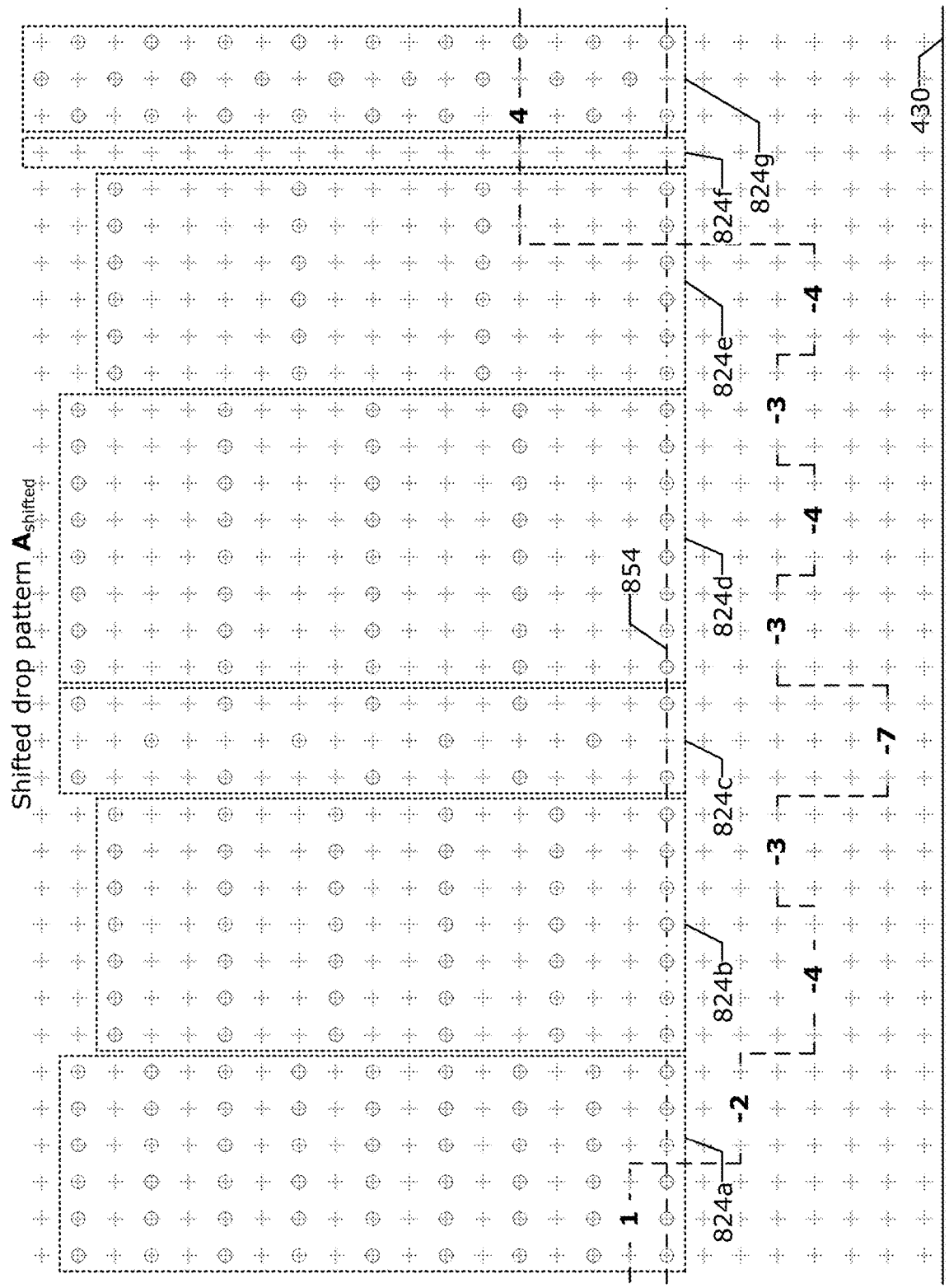

FIG. 8D is an illustration of a shifted drop pattern $A_{shifted}$. Note that all the drops in the initial drop pattern $A_0$ that were above the new base DEE relative to the imprint field edge by less than one pitch are now on the new base DEE 854. Note that the set of potential drop locations 452a has also been shifted by less than one pitch. In an embodiment, the initial drop pattern $A_0$ may include a plurality of subpatterns for example: a regular 1×2 subpattern 824a; a regular 1×3 subpattern 824b; a staggered 1×2 subpattern 824c; a regular 1×4 subpattern 824d; a regular 1×5 subpattern 824e; an empty subpattern 824f; and a staggered 1×1 subpattern 824g.

Figure 8E:
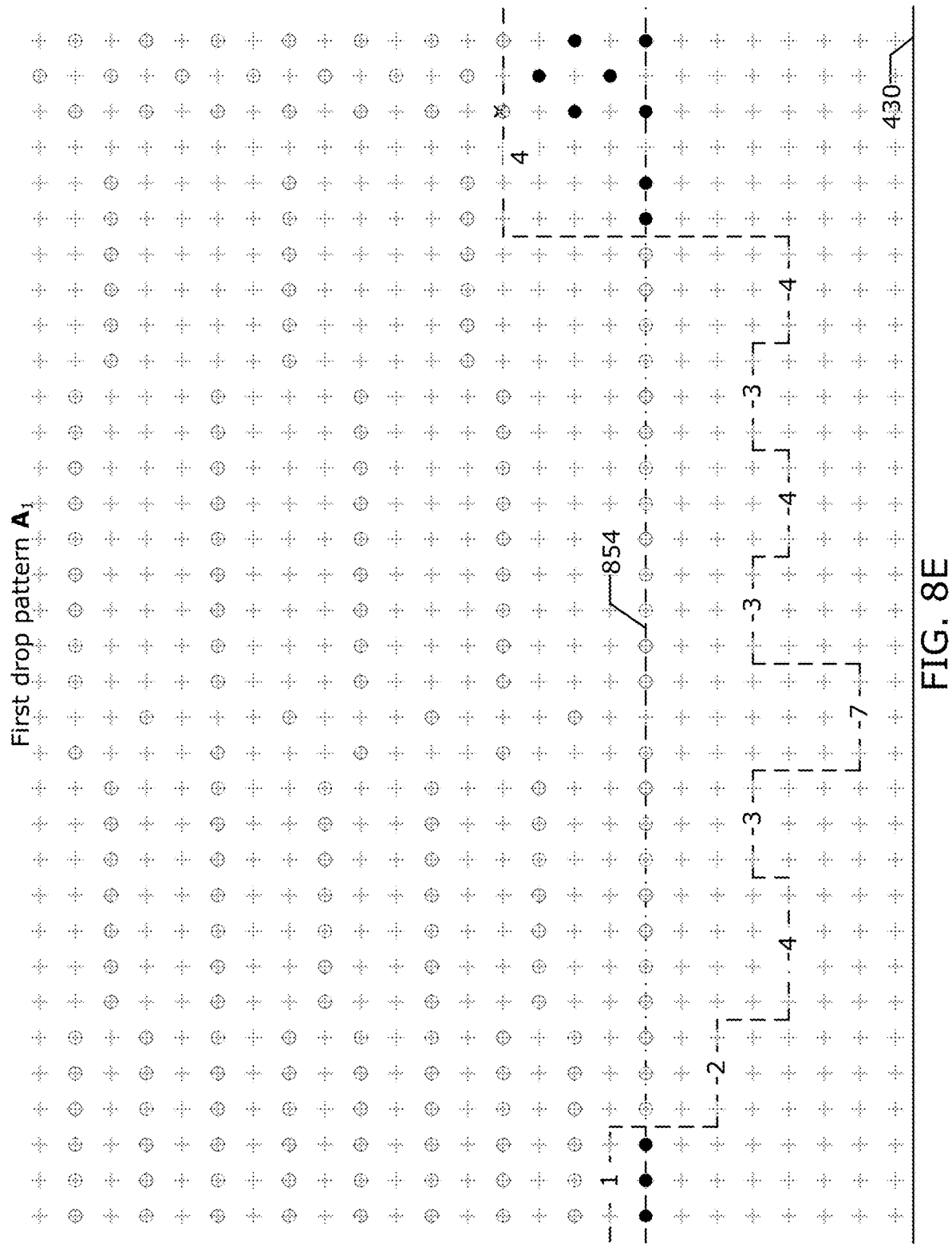

FIG. 8E is an illustration of a portion of a first drop pattern $A_1$ in which the subtracted drops are illustrated as black dots. Note that the first drop pattern $A_1$ now includes the open circles and does not include the black dots.

Figure 8F:
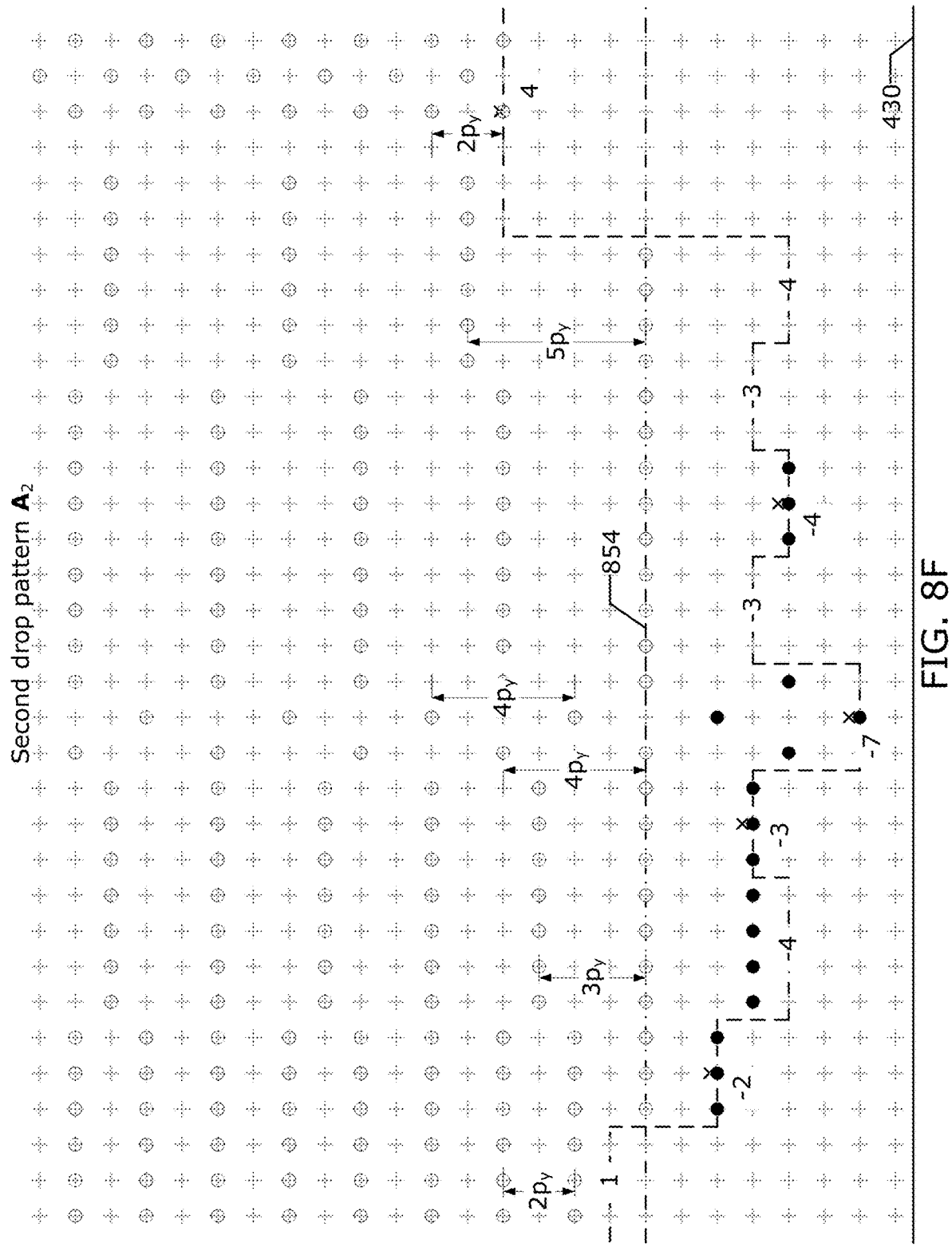

FIG. 8F is an illustration of a portion of a second drop pattern $A_2$ in which the added drops are illustrated as black dots. Note that the second drop pattern $A_2$ now includes both the open circles and the black dots. Drops are added in a manner that maintains the local drop pitches near the imprint field edge.

Figure 8G:
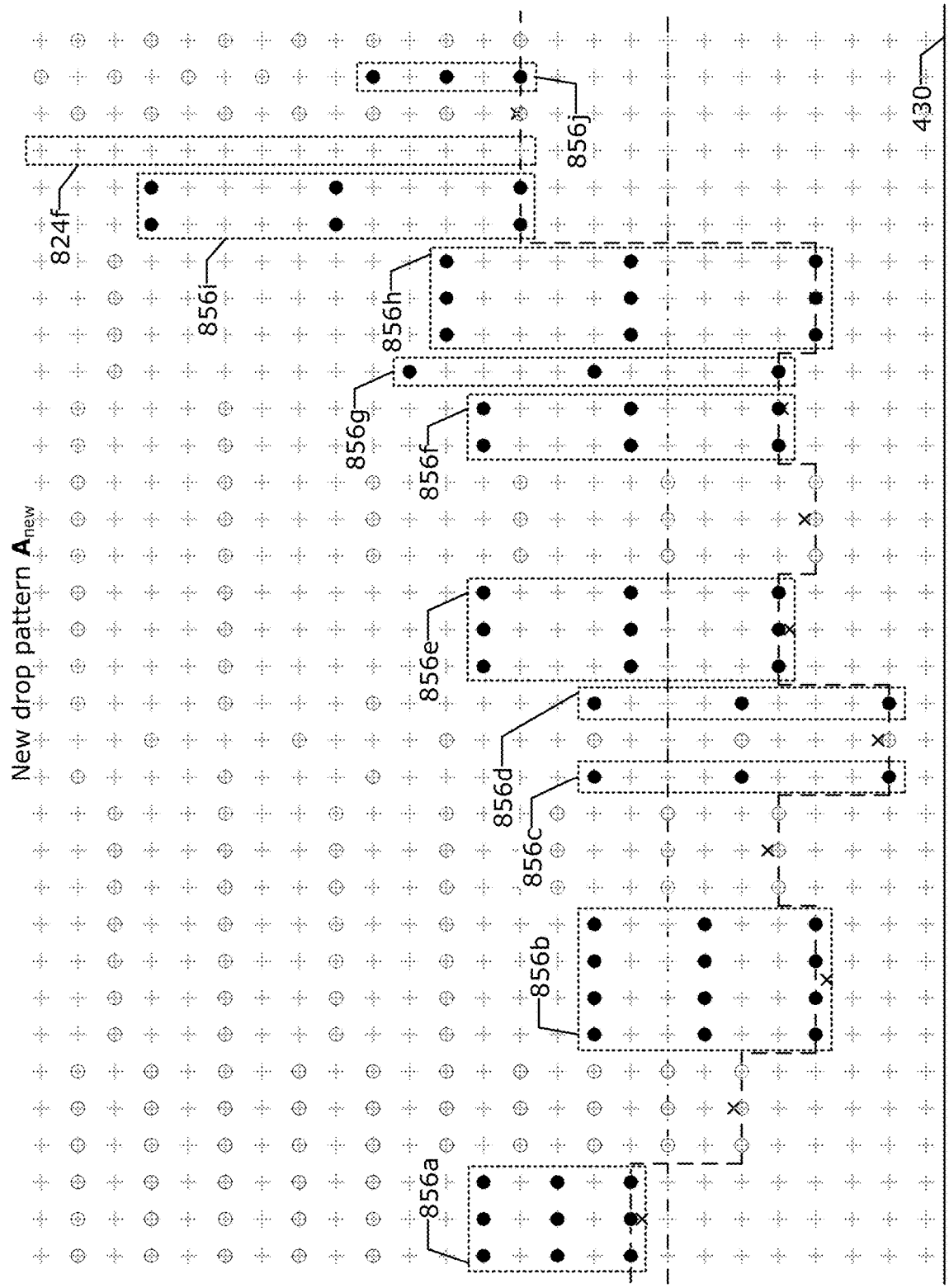

FIG. 8G is an illustration of a portion of a new drop pattern $A_{new}$ in which the drops that are shifted are illustrated as black dots. Note that the new drop pattern $A_{new}$ now includes both the open circles and the black dots. Drops are shifted in a manner that maintains the local drop pitches near the imprint field edge.

For example, a first portion 856a of the regular 1×2 subpattern 824a is shifted such that the drops which in the second drop pattern $A_2$ that are one dispensable Y-pitch $P_y$ and half a drop pitch $P_{y,drop,T}(x)$ from the shifted DEE is moved by one dispensable Y-pitch $P_y$ and half a drop pitch $P_{y,drop,T}(x)$. For example, a second portion 856b of the regular 1×3 subpattern 824b is shifted such that the drops which in the second drop pattern $A_2$ that are one dispensable Y-pitch $P_y$ and a third of a drop pitch $P_{y,drop,T}(x)$ from the shifted DEE is moved by one dispensable Y-pitch $P_y$ and a third of a drop pitch $P_{y,drop,T}(x)$. For example, a third portion 856c and a fourth portion 856d of the staggered 1×2 subpattern 824c is shifted such that the drops which are in the second drop pattern $A_2$ that are two dispensable Y-pitch $P_y$ and half of a drop pitch $P_{y,drop,T}(x)$ from the shifted DEE are moved by one dispensable Y-pitch $P_y$ and a third of a drop pitch $P_{y,drop,T}(x)$. For example, a fifth portion 856e and a sixth portion 856f of the regular 1×4 subpattern 824d are shifted such that the drops which are in the second drop pattern $A_2$ that are three dispensable Y-pitch $P_y$ and three-quarters of a drop pitch $P_{y,drop,T}(x)$ from the shifted DEE are moved by three dispensable Y-pitch $P_y$ and a three-quarters of a drop pitch $P_{y,drop,T}(x)$. For example, a seventh portion 856g of the regular 1×5 subpattern 824e is shifted such that the drops which are in the second drop pattern $A_2$ that are three dispensable Y-pitch $P_y$ and three-fifths of a drop pitch $P_{y,drop,T}(x)$ from the shifted DEE is moved by three dispensable Y-pitch $P_y$ and a three-fifths of a drop pitch $P_{y,drop,T}(x)$. For example, an eighth portion 856h of the regular 1×5 subpattern 824e is shifted such that the drops which are in the second drop pattern $A_2$ that are four dispensable Y-pitch $P_y$ and four-fifths of a drop pitch $P_{y,drop,T}(x)$ from the shifted DEE is moved by four dispensable Y-pitch $P_y$ and a four-fifths of a drop pitch $P_{y,drop,T}(x)$. For example, a ninth portion 856i of the regular 1×5 subpattern 824e is shifted such that the drops which are in the second drop pattern $A_2$ that are one dispensable Y-pitch $P_y$ and a fifth of a drop pitch $P_{y,drop,T}(x)$ from the shifted DEE is moved by one dispensable Y-pitch $P_y$ and a fifth of a drop pitch $P_{y,drop,T}(x)$. For example, a tenth portion 856j of the staggered 1×1 subpattern 824g is shifted such that the drops which are in the second drop pattern $A_2$ that are one dispensable Y-pitch $P_y$ and a half of a drop pitch $P_{y,drop,T}(x)$ from the shifted DEE is moved by one dispensable Y-pitch $P_y$ and a half of a drop pitch $P_{y,drop,T}(x)$.

As illustrated in FIG. 8G the drop pattern may include one or more empty subpatterns that includes a drop position that is on the shifted DEE in which case the new drop pattern $A_{new}$ has no drop on the shifted DEE where it intersects with the empty subpattern(s). The empty subpattern extends perpendicular to the imprint field edge a multiplier of a dispensable pitch that is greater than the drop pitch of subpatterns that surround the empty subpattern.

The applicant has determined that the performance of the imprinting process 300 improves (lower defects) when at least one row of a subpattern is moved on to the shifted DEE. The applicant has determined that the performance of the imprinting process 300 has even greater improvement (even lower defects) when the subpatterns that are moved in step S654 include multiple (for example 3) rows or columns perpendicular to the imprint field edge and after the moving step S654 the subpatterns have the same local drop pitch as the second drop pattern $A_2$.

Figure 8H:
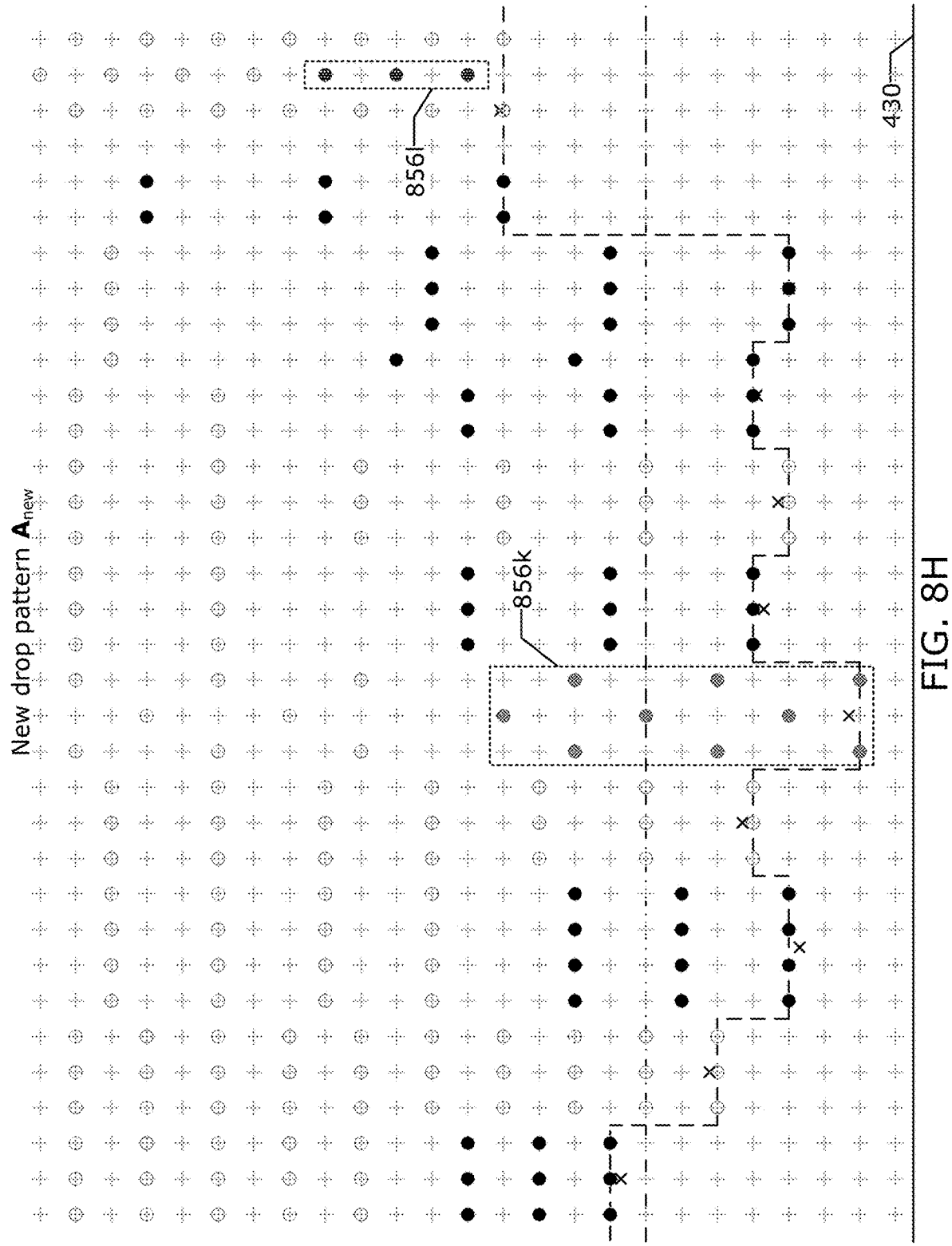

When portions (856c, 856d and 856j) of staggered subpatterns (824c and 824g) are moved during the moving drops step S654 there is a risk that resultant subpatterns are no longer staggered subpatterns but are instead regular subpatterns as shown in the new drop pattern illustrated in FIG. 8G. In an alternative embodiment, the moving drops step S654 is performed in a manner that maintains the staggered subpattern as illustrated in the new drop pattern $A_{new}$ in FIG. 8H. For example, an eleventh portion 856k of the staggered 1×2 subpattern 824c is shifted such that the drops which are in the second drop pattern $A_2$ that the staggered grid is maintained and a portion of drops in the staggered grid are positioned on shifted DEE. For example, a twelfth portion 856l of the staggered 1×1 subpattern 824g is not shifted at all in the second drop pattern $A_2$ so that the staggered grid is maintained and a portion of drops in the staggered grid are positioned on the shifted DEE.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of generating a drop pattern comprising:
    receiving, by a processor, an initial drop pattern;
    receiving, by the processor, a set of target drop pattern exclusion edge (DEE) parameters that varies across a plurality of locations along an imprint field edge;
    receiving, by the processor, one or more constraints of a dispensing system;
    generating, with the processor, a base drop pattern exclusion edge line based on the set of target drop pattern exclusion edge parameters;
    generating, with the processor, a new drop pattern wherein drops deposited at an edge of the new drop pattern are positioned on integer multiples of a pitch constraint from the base drop pattern exclusion edge line;
    sending the new drop pattern to the dispensing system; and
    dispensing the new drop pattern with the dispensing system.

2. The method of claim 1 wherein the one or more constraints includes the pitch constraint of the dispensing system perpendicular to the edge of the new drop pattern.

3. The method of claim 1, wherein each of the set of target drop pattern exclusion edge parameters is a largest distance from the imprint field edge among a plurality of imprint field edges for a given location among the plurality of locations along the first imprint field edge at which the area adjacent to the first imprint field edge under a mesa is predicted to be filled with formable material from the new drop pattern.

4. The method of claim 1, wherein the base drop pattern exclusion edge line is a straight line parallel to an average position of a side wall of a mesa that is used for imprinting the new drop pattern.

5. The method of claim 1, wherein determining the base drop pattern exclusion edge line includes determining a difference between positions of drops on the edge of the new drop pattern and the set of target drop pattern exclusion edge parameters.

6. The method of claim 1, further comprising:
    determining a minimum value of the set of target drop pattern exclusion edge parameters;
    determining a maximum value of the set of target drop pattern exclusion edge parameters; and
    wherein the base drop pattern exclusion edge line is between the minimum value and maximum value.

7. The method of claim 1, wherein the new drop pattern minimizes extrusion defects and non-fill defects.

8. The method of claim 1, wherein the constraints of the dispensing system includes a set of potential dispense locations and their relative positions to each other.

9. The method of claim 8, wherein an origin position of the set of potential dispense location is adjustable relative to a mesa sidewall and the origin position intersects with the base drop pattern exclusion edge line.

10. The method of claim 1, wherein generating the new drop pattern comprises:

generating a shifted drop pattern by shifting the initial drop pattern such that a portion of the dispensed drops land on the base drop pattern exclusion edge line.

11. The method of claim 10, wherein generating the new drop pattern further comprises:
   determining a set of integer multiples which vary along the imprint field edge on which indicated dispensable pitch offsets from the base drop pattern exclusion edge line on which drops are to be positioned; and
   adding drops to the shifted drop pattern which take into account integer multiples and a local pitch of the shifted drop pattern near the imprint field edge.

12. The method of claim 10, wherein generating the new drop pattern further comprises:
   determining a set of integer multiples which vary along the imprint field edge on which indicated dispensable pitch offsets from the base drop pattern exclusion edge line on which drops are to be positioned; and
   removing drops to the shifted drop pattern which take into account the integer multiples and a local pitch of the shifted drop pattern near the imprint field edge.

13. The method of claim 10, wherein generating the new drop pattern further comprises:
   determining a set of integer multiples which vary along the imprint field edge on which indicated dispensable pitch offsets from the base drop pattern exclusion edge line on which drops are to be positioned;
   moving drops in the shifted drop pattern which take into account the integer multiples and a local pitch of the shifted drop pattern near the imprint field edge.

14. A method of manufacturing articles including using the method of generating the drop pattern recited in claim 1, the method of manufacturing articles further comprising:
   dispensing formable material with the generated drop pattern onto a substrate;
   contacting the dispensed formable material with a template;
   solidifying the formable material under the template;
   separating the template from the solidified formable material to form a film layer on the substrate; and
   processing the substrate on which the film layer is produced so as to manufacture the articles.

15. A system comprising:
   a dispensing system
   a memory; and
   a processor configured to:
      receive an initial drop pattern;
      receive a set of target drop pattern exclusion edge (DEE) parameters that varies across a plurality of locations along an imprint field edge;
      receive one or more constraints of the dispensing system;
      generate a base drop pattern exclusion edge line based on the set of target drop pattern exclusion edge parameters;
      generate a new drop pattern wherein drops deposited at an edge of the new drop pattern are positioned on integer multiples of a pitch constraint from the base drop pattern exclusion edge line;
      send the new drop pattern to the dispensing system.

16. A non-transitory computer readable memory encoded with instructions for performing a method of generating a drop pattern comprising:
   receiving an initial drop pattern;
   receiving a set of target drop pattern exclusion edge (DEE) parameters that varies across a plurality of locations along an imprint field edge;
   receiving one or more constraints of a dispensing system;
   generating a base drop pattern exclusion edge line based on the set of target drop pattern exclusion edge parameters; and
   generating a new drop pattern wherein drops deposited at an edge of the new drop pattern are positioned on integer multiples of a pitch constraint from the base drop pattern exclusion edge line.

\* \* \* \* \*